(12) United States Patent  
Chaivipas et al.

(10) Patent No.: US 9,019,017 B2  
(45) Date of Patent: Apr. 28, 2015

(54) DIGITALLY CONTROLLED OSCILLATOR AND DIGITAL PLL INCLUDING THE SAME

(71) Applicants: Fujitsu Limited, Kawasaki-shi, Kanagawa (JP); Fujitsu Semiconductor Limited, Yokohama-shi, Kanagawa (JP)

(72) Inventors: Win Chaivipas, Kawasaki (JP); Masazumi Marutani, Yokohama (JP); Daisuke Yamazaki, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 105 days.

(21) Appl. No.: 13/765,305

(22) Filed: Feb. 12, 2013

(65) Prior Publication Data

US 2013/0147561 A1    Jun. 13, 2013

Related U.S. Application Data

(63) Continuation of application No. PCT/JP2010/063741, filed on Aug. 13, 2010.

(51) Int. Cl.
*H03L 7/085*  (2006.01)
*H03L 7/089*  (2006.01)
(Continued)

(52) U.S. Cl.
CPC ............... *H03L 7/00* (2013.01); *H03L 7/0994* (2013.01); *H03L 7/0991* (2013.01); *H03L 7/146* (2013.01); *H03J 2200/10* (2013.01); *H03L 7/093* (2013.01); *H03L 7/099* (2013.01)

(58) Field of Classification Search
CPC ....... H03L 7/0991; H03L 7/0994; H03L 7/00; H03L 7/146; H03L 7/093; H03L 7/099; H03J 2200/10

USPC ..... 327/150, 159; 331/1 A, 1 R, 16, 34, 36 C, 331/117 R, 117 FE, 167, 177 R, 177 V; 375/376

See application file for complete search history.

(56) References Cited

U.S. PATENT DOCUMENTS

2004/0051590 A1 *  3/2004  Perrott et al. ................. 331/1 A
2004/0189503 A1    9/2004  Melanson
(Continued)

FOREIGN PATENT DOCUMENTS

JP    11-031971 A    2/1999
JP    2008-136202 A  6/2008
JP    2010-098704 A  4/2010

OTHER PUBLICATIONS

A.V. Rylyakov et al., "A Wide Power-Supply Range (0.5V-to_1.3V) Wide Tuning Range (500MHz-to-8 GHz) All-Static CMOS AD PLL in 65nm SOI", IEEE International Solid_State Circuits Conference, Digest Technical Papers, 2007, pp. 172-173.

(Continued)

*Primary Examiner* — Arnold Kinkead
*Assistant Examiner* — Richard Tan
(74) *Attorney, Agent, or Firm* — Arent Fox LLP

(57) ABSTRACT

A digitally controlled oscillator has a high-order ΔΣ modulator configured to be of at least an order higher than a first order and configured to input a digital control signal and output a pseudorandom digital output signal, a first-order ΔΣ modulator configured to input the pseudorandom digital output signal and generate a control pulse signal including a pulse width corresponding to the pseudorandom digital output signal, a low pass filter configured to pass a low frequency component of the control pulse signal, and an oscillator configured to generate a high-frequency output signal whose frequency is controlled based on the control pulse signal outputted by the low pass filter so as to be a frequency corresponding to the digital control signal.

10 Claims, 25 Drawing Sheets

(51) Int. Cl.
  *H03L 7/00* (2006.01)
  *H03L 7/14* (2006.01)
  *H03L 7/093* (2006.01)
  *H03L 7/099* (2006.01)

(56) References Cited

U.S. PATENT DOCUMENTS

2005/0147197 A1* 7/2005 Perrott .......................... 375/376
2010/0097150 A1* 4/2010 Ueda et al. ...................... 331/25

OTHER PUBLICATIONS

Mark A. Ferriss et al., "A 14 mW Fractional-N PLL Modulator Wth a Digital Phase Detector and Frequency Switching Scheme", IEEE Journal of Solid-State Circuits, Nov. 2008, vol. 43, No. 11, pp. 2464-2471.

Paolo Madoglio et al., "Quantization Effects in All-Digital Phase-Locked Loops", IEEE Transactions on Circuits and Systems, Dec. 2007, vol. 54, No. 12, pp. 1120-1124.

* cited by examiner

ANALOG SIGNAL (IDEAL) − DIGITAL SIGNAL = ERROR (NOISE)

FIG.11A
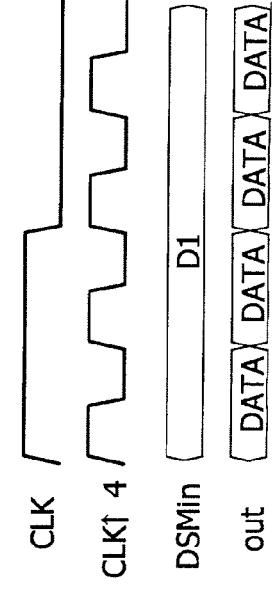
FIG.11B
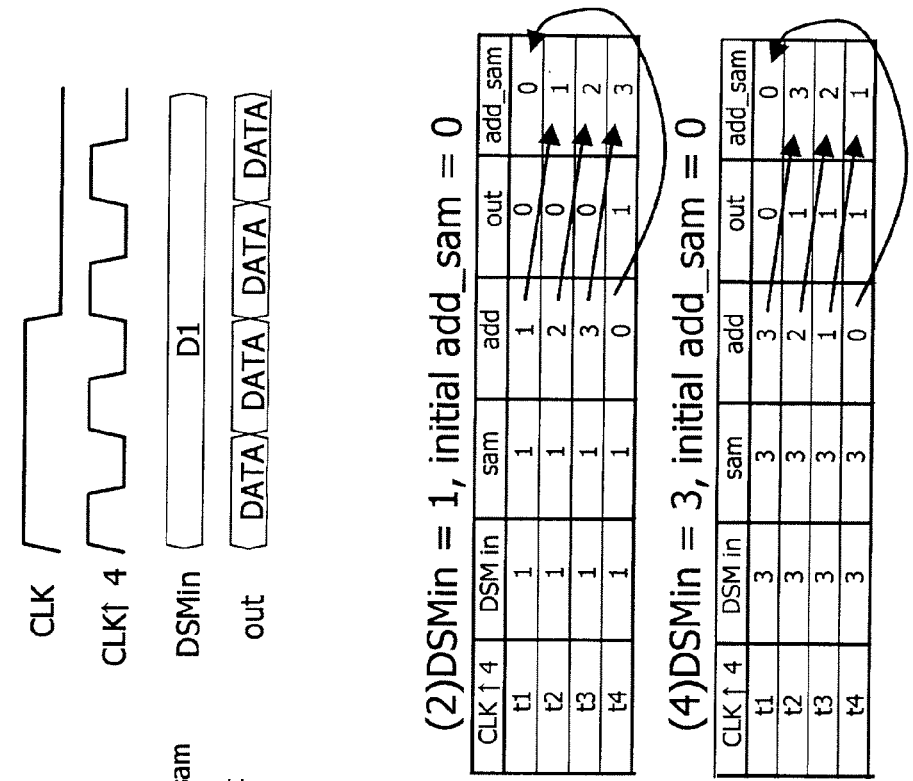
FIG.11C

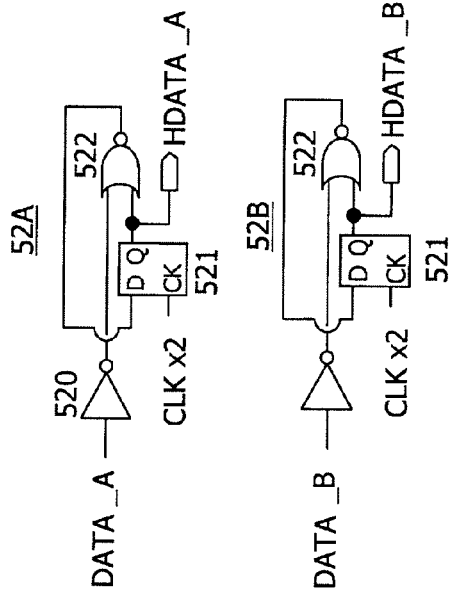
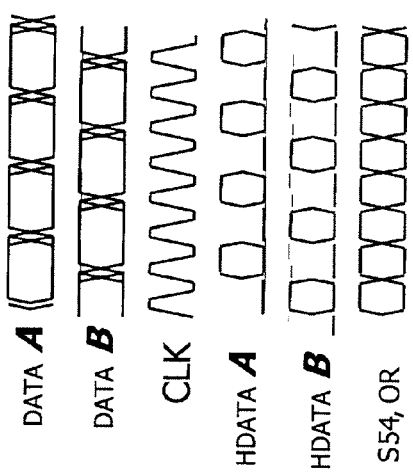
FIG.20A
FIG.20B
FIG.20C

FIG.23

DIGITALLY CONTROLLED OSCILLATOR AND DIGITAL PLL INCLUDING THE SAME

CROSS-REFERENCE TO RELATED APPLICATION

This application is a continuation application of International Application PCT/JP2010/063741, filed Aug. 13, 2010 and designated the U.S., the entire contents of which are incorporated herein by reference.

FIELD

The present invention relates to a digitally controlled oscillator and a digital PLL including the digitally controlled oscillator.

BACKGROUND

PLL (Phase-Locked Loop) has been used as a clock synthesizer in various fields such as wireless transmission/reception apparatuses, clock data recovery systems, and processors. PLL includes a phase comparator, a loop filter, a voltage controlled oscillator, and a divider, as basic configuration elements.

PLL used in the wireless apparatuses and the like is demanded to generate a high-frequency clock signal with high accuracy. For example, with regards to WiMAX and GSM1800, it is demanded to keep the frequency of 2.5 GHz within an allowable range of 130 Hz.

On the other hand, with respect to a digital PLL, the digital signal of a reference frequency is inputted, and an oscillator generates a high-frequency output signal based on a digital control signal outputted from a loop filter, and the digital signal having the frequency of the high-frequency output signal is fed back to a phase comparator. Thus, there have been attempts to apply digital circuits to all the elements except for the oscillator. For example, the digital PLL is disclosed by the following patent documents (Japanese Unexamined Patent In the digital PLL, the frequency of the oscillator is controlled based Application Publication No. 11-31971; Japanese Unexamined Patent Application In the digital PLL, the frequency of the oscillator is controlled based Publication No. 2008-136202) and a non-patent document ("A 14 mW Fractional-N PLL Modulator With a Digital Phase Detector and Frequency Switching Scheme." *IEEE JOURNAL OF SOLID-STATE CIRCUITS*, volume 43, no. 11, November 2008).

SUMMARY

In the digital PLL, the frequency of the oscillator is controlled based on the digital control signal outputted from the loop filter. Accordingly, it has been proposed that a high-order ΔΣ modulator is provided to generate a random digital output signal from the digital control signal, and the random digital output signal is digital-to-analog converted into an analog control signal, thereby controlling the frequency of the oscillator.

However, a conventional DA converter generates an analog output voltage between a power supply voltage and ground. Accordingly, the accuracy of the analog output voltage deteriorates due to the fluctuation of the power supply voltage, and the dynamic range of the analog output voltage is narrowed due to the reduction of the power supply voltage, which leads to the low resolution.

One aspect of a digitally controlled oscillator includes a high-order ΔΣ modulator configured to be of an order higher than a first order and configured to input a digital control signal and output a pseudorandom digital output signal;

a first-order ΔΣ modulator configured to input the pseudorandom digital output signal and generate a control pulse signal including a pulse width corresponding to the pseudorandom digital output signal;

a low pass filter configured to pass a low frequency component of the control pulse signal; and an oscillator configured to generate a high-frequency output signal whose frequency is controlled based on the control pulse signal outputted by the low pass filter so as to be a frequency corresponding to the digital control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 11A, 11B, and 11C are a diagram, an operational waveform, and tables to illustrate the operation of the first-order ΔΣ modulator 30;

FIGS. 20A, 20B, and 20C are diagrams illustrating the configuration and operation of the pulse-width half-reduction circuits;

FIG. 23 is a configuration circuit of the fourth-order ΔΣ modulator of the digitally controlled oscillator of the embodiment of the present invention;

DESCRIPTION OF EMBODIMENTS

Figure 1:
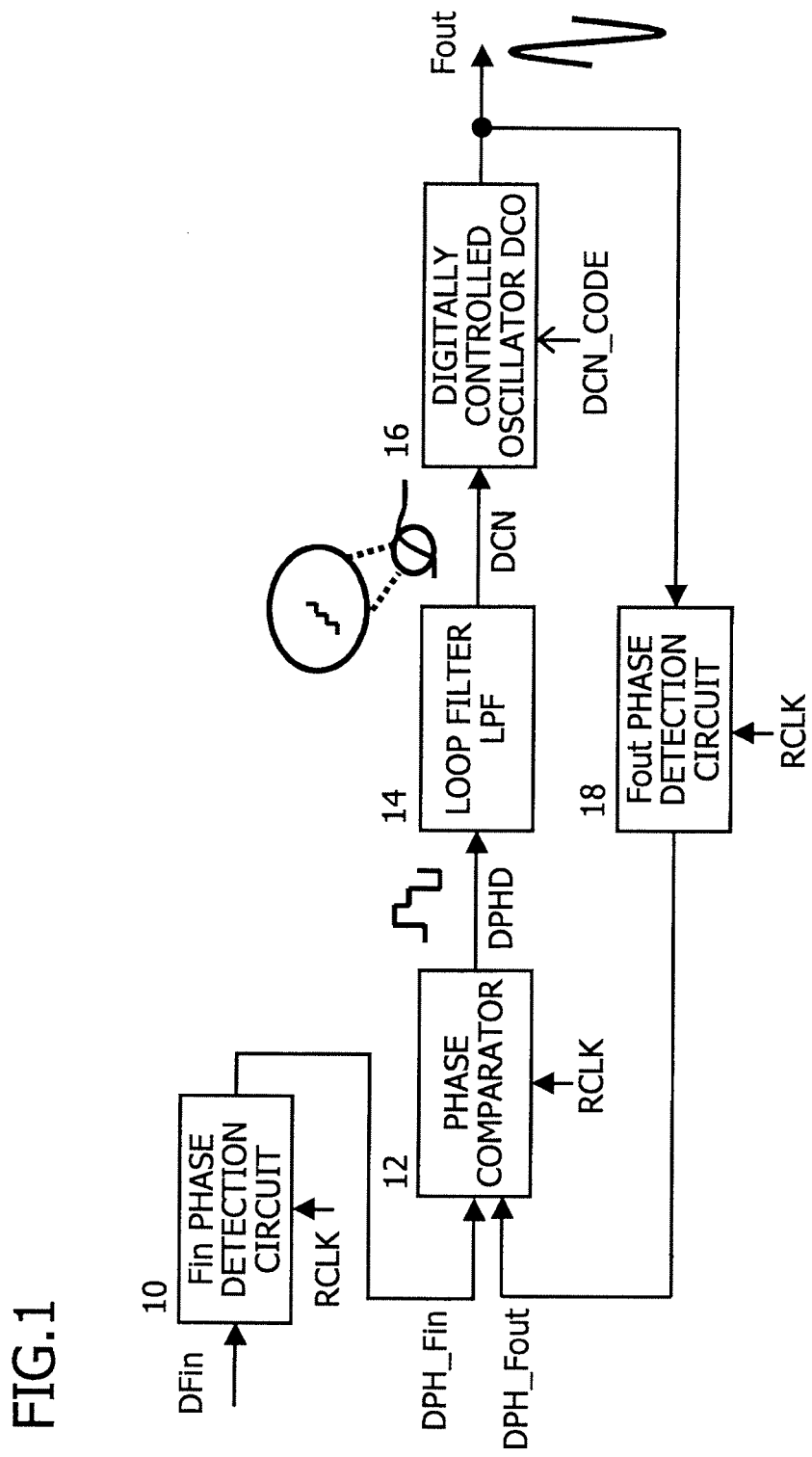
FIG. 1 is a circuit diagram of a digital PLL of an embodiment of the present invention.

FIG. 1 is circuit diagram of a digital PLL according to the embodiment of the present invention. The PLL includes a phase comparator 12 to compare a reference phase signal DPH_Fin generated from a digital reference frequency signal DFin with an output phase signal DPH_Fout generated from a high-frequency output signal Fout so as to output a digital phase difference signal DPHD, a loop filter 14 to remove high frequency components from the digital phase difference signal DPHD and output a digital control signal DCN corresponding to the digital phase difference signal, and a digitally controlled oscillator 16 to generate the high-frequency output signal Fout having a frequency controlled based on the digital control signal DCN.

A Fin phase detection circuit 10 integrates the digital reference frequency signal DFin in synchronized with a reference clock signal RCLK, so as to generate the reference phase signal DPH_Fin. The digital reference frequency signal DFin is the value of division of a desired frequency of the high-frequency output signal by the frequency of the reference clock signal. For example, assuming that the reference clock signal RCLK is 1 MHz, and the desired frequency of high-frequency output signal is 100 MHz, the digital reference frequency signal DFin is set to "100". In general, when the frequency of a certain signal is integrated in synchronized with the reference clock signal, the signal having the frequency is turned into a signal having the phase information. The Fin phase detection circuit 10 operates based on this principle.

Similarly, a Fout phase detection circuit 18 counts the rising edge of the high-frequency output signal Fout for every one cycle of the reference clock signal RCLK and integrates the count value in synchronism with the reference clock signal RCLK. That is, the number of waves of the high-frequency output signal Fout during one cycle of the reference clock signal RCLK corresponds to the aforementioned digital reference frequency signal DFin. The Fout phase detection circuit 18 operates based on the principle described above.

The loop filter 14 removes the high frequency components of the digital phase difference signal DPHD, passes the low frequency components, and generates the smoothed digital control signal DCN. The digitally controlled oscillator 16 is a sort of VCO (Voltage Controlled Oscillator) and generates the high-frequency output signal Fout having a frequency based on the digital control signal DCN. Further, the digitally controlled oscillator 16 changes a frequency range controlled with the digital control signal DCN, based on a control code DCN_CODE from a PLL control unit not shown. For example, when the frequency deviates from the frequency range into an unlocked state, the frequency range in a locked state is selected based on the control code DCN_CODE.

As is described above, the digital PLL is constituted by digital circuits to cope with digital signals except for the digitally controlled oscillator 16, which is suitable for the high integration and insusceptible to the problems of process dependence and the influence of fluctuation of power supply, which are unique to analog circuits.

Figure 2A:
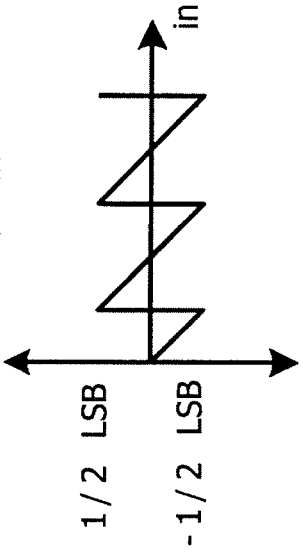
FIGS. 2A and 2B are diagrams to illustrate characteristics of a digitally controlled oscillator.
Figure 2B:
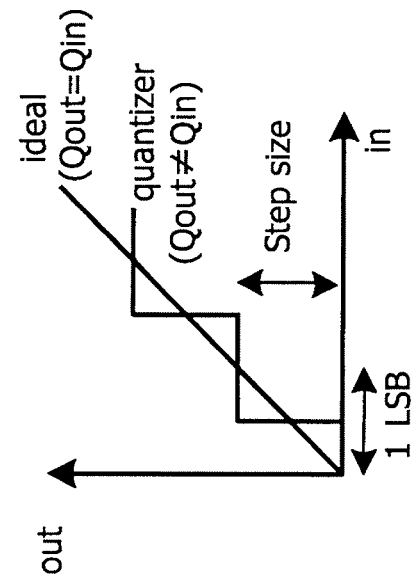

FIGS. 2A and 2B are graphs to represent the characteristics of the digitally controlled oscillator. FIG. 2A illustrates the relation of an analog signal and a digital signal. In the case of an analog controlled oscillator, a frequency output Qout (=Qin) corresponding to a voltage with respect to the input Qin of an analog control voltage is obtained. However, in the case of the input Qin of a digital control signal, a discrete frequency output Qout (not equal to Qin) corresponding to the digital input is obtained. As a result, as is illustrated in FIG. 2B, there occurs an error Error between the ideal value of an analog output and the value of a discrete digital output. The digital PLL is demanded to correct the error.

First Embodiment

Figure 3A:
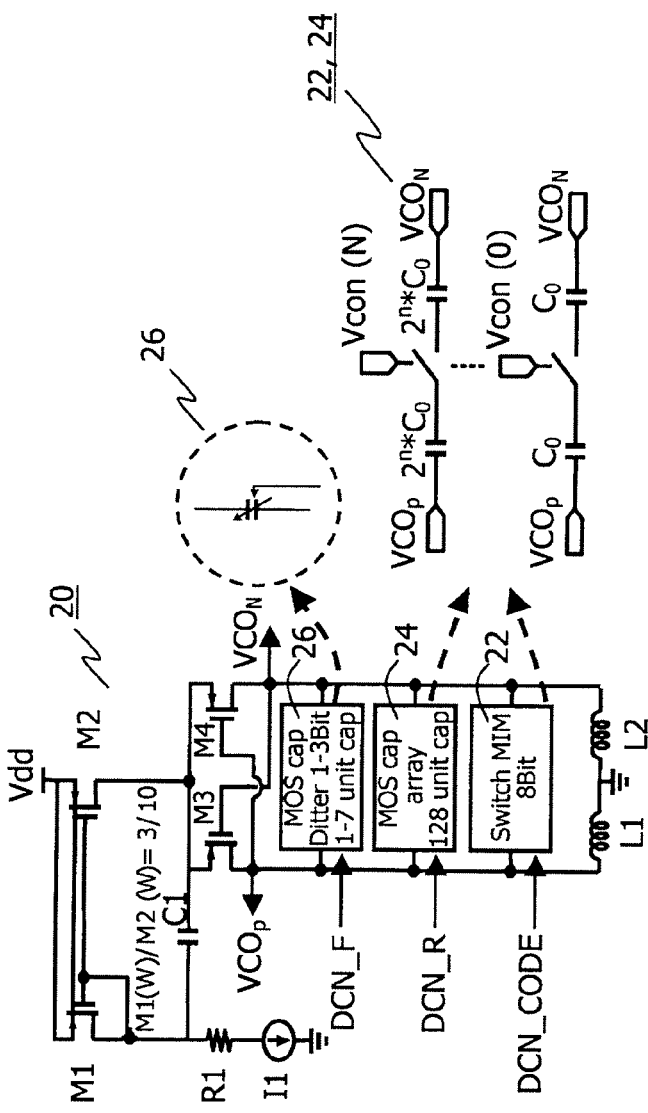
FIGS. 3A and 3B are diagrams to illustrate a configuration and output characteristics of an oscillator as an example of the digitally controlled oscillator.
Figure 3B:
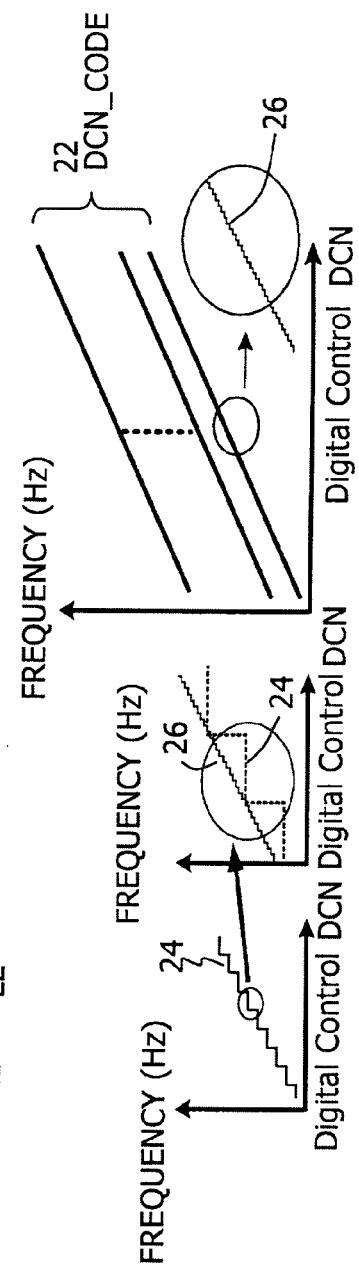

FIGS. 3A and 3B are diagrams to illustrate the configuration and output characteristics of the digitally controlled oscillator of a first embodiment of the present invention. In an oscillator 20, a current mirror circuit is constituted by transistors M1 and M2, and a current corresponding to the size ratio of the transistors M1 and M2 with respect to a constant current I1 flows in an LC oscillation circuit. The LC oscillation circuit includes transistors pairs M3 and M4 whose drain and gate are respectively cross-connected, to which the constant current is supplied from the transistor M2, inductors L1 and L2 provided between output pairs VCON and VCOP, capacitance circuits 22, 24, and 26 made up of a capacitor array provided between the output pairs VCON and VCOP.

As is illustrated in the diagram, the capacitor array 22 is constituted by capacitors pairs whose capacitance is represented as a value that a reference capacitance C0 is multiplied by a power of two, that is, $2^k$ (k=0 to n), and switches that are respectively on/off controlled based on the bits Vcon(0) to Vcon(n) of the digital control signal. When these switches are turned on, the capacitance value of the LC oscillation circuit increases, whereby reducing the frequency. The capacitors of the capacitor array 22 are capacitors made up of a metal layer, an insulation layer, and the metal layer MIM (MIM; Metal Insulator Metal), or MOM (Metal oxide metal) which have a relatively large amount of capacitance.

In contrast, the capacitors of the capacitor array 24 are capacitors in which capacitance between the gate and the source-drain of MOS transistor is utilized, and the capacitor array 24 has a relatively small amount of capacitance, compared with the MIM or MOM described above. As is illustrated in the diagram, and the capacitor array 24 is constituted by capacitor pairs and switches that are respectively on/off controlled based on bits Vcon(0) to Vcon(n) of the digital control signal. However, the capacitance value of the capacitor pairs is not the value that the reference capacitance C0 is multiplied by a power of two, and 128 sets of capacitor pairs have an equal capacitance value.

The capacitor array 26 includes variable capacitors in which capacitance between the gate and the source-drain of MOS transistor is utilized, and the control signal is applied to the gate electrode, and the capacitance value is controlled. Accordingly, the capacitor array 26 controls a capacitance value smaller than the capacitance value of the capacitor array 24. The capacitor array 26 includes the variable capacitors in which a few MOS transistors are connected in parallel.

As is illustrated in the output characteristics in FIG. 3B, the capacitance value of the capacitor array 22 whose capacitance is the largest is controlled based on the digital control code DCN_CODE in response to the digital control signal DCN, whereby changing the frequency control range. Next, the capacitance value of the capacitor array 24 whose capacitance is the second largest is controlled based on the digital control signal DCN_R for rough adjustment, and the frequency is adjusted to a discrete value. The capacitance value of the capacitor array 26 whose capacitance is the smallest is controlled based on the digital control signal DCN_F for fine adjustment, which serves as a capacitance value to interpolate discrete frequencies controlled based on the digital control signal DCN_R for rough adjustment.

Thus, the error illustrated in FIGS. 2A and 2B is excluded by fine-tuning the capacitance value of the capacitor array 26 whose capacitance is the smallest.

Figure 4:
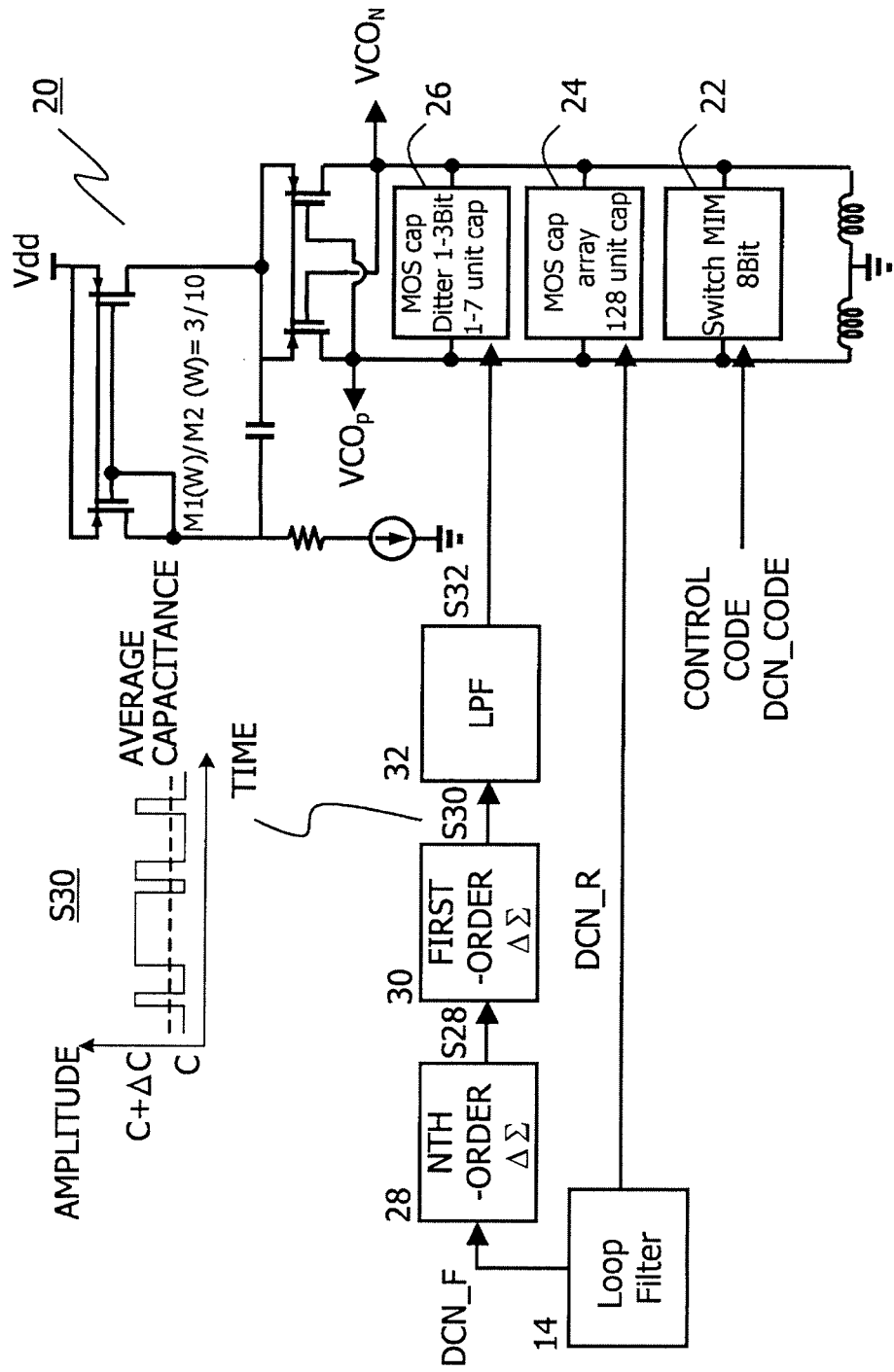
FIG. 4 is a configuration diagram of a digitally controlled oscillator DCO of the embodiment of the present invention.

FIG. 4 is a configuration diagram of the digitally controlled oscillator (DCO) 16 of the embodiment of the present invention. The digitally controlled oscillator 16 is constituted by the oscillator 20 described in FIGS. 3A and 3B and circuits to generate control signals to control the capacitor arrays 24 and 26 of the oscillator 20 based on the digital control signal DCN from the loop filter 14. For example, the digital control signal DCN outputted from the loop filter 14 is divided into the high-order 7-bit digital control signal DCN_R for rough adjustment and the low-order 15-bit digital control signal DCN_F for fine adjustment. The digital control signal DCN_R for rough adjustment is decoded and supplied as an on/off control signal for 128 sets of switches of the capacitor array 24.

In contrast, the digital control signal DCN_F for fine adjustment needs to be converted into an analog control voltage applied to the gate electrode of the variable capacitor (MOS cap capacitor) in the capacitor array 26. Accordingly, the digitally controlled oscillator DCO includes a high-order ΔΣ modulator 28 that has an order higher than a first order, wherein the digital control signal DCN_F is inputted, and a pseudorandom digital output signal S28 is outputted, a first-order ΔΣ modulator 30 in which the pseudorandom digital output signal S28 is inputted so as to generate a control pulse signal S30 having a pulse width corresponding to the pseudorandom digital output signal S28, and a low pass filter 32 to pass the low-frequency components of the control pulse signal S30. The analog control voltage S32 passed through the low pass filter 32 is applied to the gate electrode of the variable capacitor of the capacitor array 26, whereby controlling the capacitance value of the variable capacitor.

Figure 5:
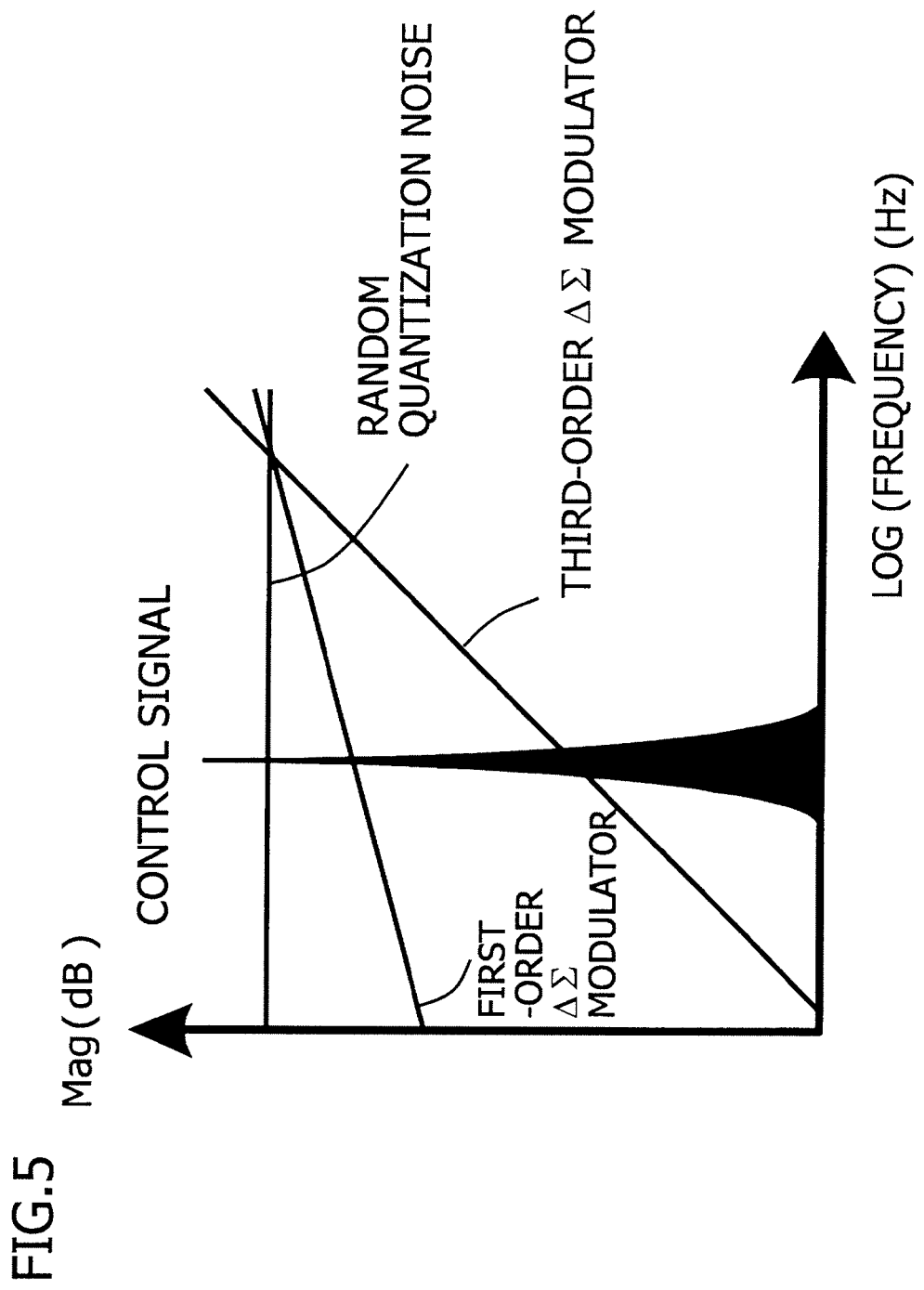
FIG. 5 is a graph illustrating noise shaping by a ΔΣ modulator.

FIG. 5 is a graph illustrating noise shaping by the ΔΣ modulator. The horizontal axis represents a frequency bandwidth, and the vertical axis represents signal intensity (voltage amplitude). Quantization noise with regards to a random digital signal occurs in all frequency bandwidth, and a certain degree of quantization noise occurs in the frequency bandwidth of the control signal, which deteriorates SNR (Signal-to-Noise Ratio; SN ratio). On the contrary, the ΔΣ modulator generates a pseudorandom digital output by oversampling in synchronism with a high-frequency clock signal, whereby the quantization noise increases in the high-frequency bandwidth and decreases in the low-frequency bandwidth.

FIG. 5 illustrates the quantization noise of the first-order ΔΣ modulator and the quantization noise of the third-order ΔΣ modulator that has an order higher than the first order. This represents that the quantization noise in the low-frequency bandwidth is remarkably reduced in the case of the high-order ΔΣ modulator.

The digital control signal DCN_F for fine adjustment is a random digital signal and includes noise component in the wide frequency bandwidth as described above. In contrast, the high-order ΔΣ modulator 28 generates the pseudorandom digital output signal S28, which makes it possible to carry out noise shaping to suppress the noise component in the low-frequency bandwidth. Further, the low pass filter 32 removes the high-frequency bandwidth to remove the quantization noise, which remarkably improves SNR. As a result, the high resolution outputted by the high-order ΔΣ modulator 28 is utilized.

Thus, according to the use of the higher-order ΔΣ modulator 28, the digital control signal DCN_F for fine adjustment is converted into the pseudorandom digital output signal S28 having high resolution. However, the use of the high-order ΔΣ modulator 28 leads to an increase in the number of bits of the pseudorandom digital output signal S28. For example, the output signal of the second-order ΔΣ modulator consists of two bits, and the output signal of the third-order ΔΣ modulator consists of three bits. When the capacitors of the oscillator are directly controlled with the 3-bit signal, the oscillation frequency is instantly modulated in succession, whereby jitter occurs in the oscillation frequency. In order to suppress the occurrence of the jitter, it is effective to smooth the 3-bit signal through the low pass filter.

Figure 6:
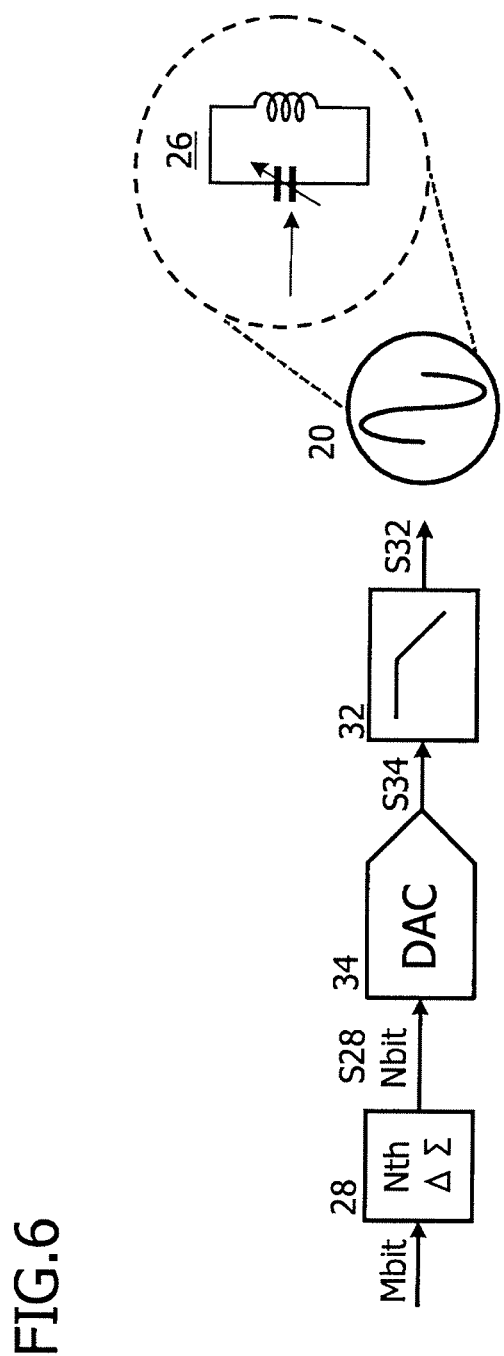
FIG. 6 is a diagram of the digitally controlled oscillator illustrated as one example.

FIG. 6 is a diagram of the digitally controlled oscillator illustrated as one example. In order to suppress the occurrence of the jitter described above, the digitally controlled oscillator in FIG. 6 includes the high-order ΔΣ modulator 28, a DAC (Digital Analog Converter) 34 to digital-to-analog convert the pseudorandom digital output signal S28, and the low pass filter 32 to smooth the analog output signal S34 of the DAC 34. The electrodes of the variable capacitor in the capacitor array 26 are controlled based on the analog output signal S32 smoothed by the low pass filter 32, whereby suppressing the jitter of the oscillation frequency.

However, DAC is basically an analog circuit, which provides a narrow dynamic range with regards to the low power supply voltage corresponding to the latest process and which fails to enhance the resolution with regards to the analog output signal S32. Further, the accuracy of the analog output signal is reduced due to the fluctuation of power supply and the process variability. Accordingly, it is not appropriate to use the DAC.

Figure 7A:
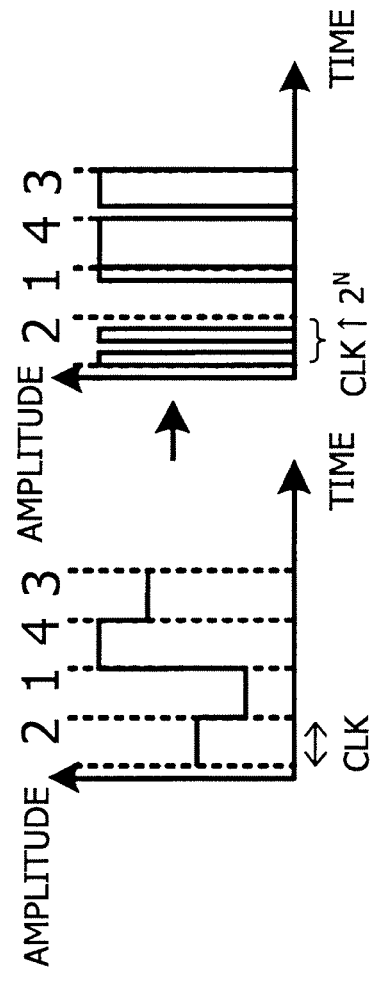
FIGS. 7A and 7B are a diagram and graphs to illustrate the configuration and operation of the digitally controlled oscillator of the embodiment of the present invention.
Figure 7B:
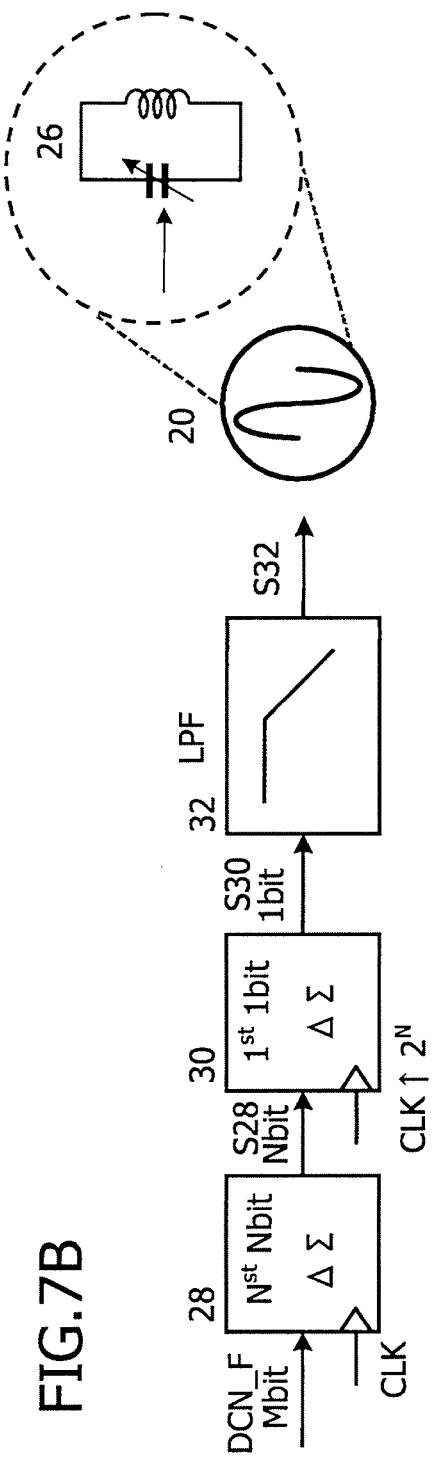

FIGS. 7A and 7B are diagrams and graphs to illustrate the configuration and operation of the digitally controlled oscillator of the embodiment of the present invention. FIG. 7B illustrates the configuration of the oscillator 20 controlled based on the digital control signal DCN_F for fine adjustment illustrated in FIG. 4. As is the same case with FIG. 4, the high-order (Nth order) ΔΣ modulator 28 modulates the M-bit digital control signal DCN_F for fine adjustment and generates the N-bit pseudorandom digital output signal S28.

In the waveform diagram in FIG. 7A, one example of the pseudorandom digital output signal S28 is illustrated on the left side of the diagram. The high-order ΔΣ modulator 28 generates the pseudorandom digital output in synchronism with the clock signal CLK. In FIG. 7A, "2, 1, 4, 3" is outputted as the example of the pseudorandom digital output signal S28.

In FIG. 7B, the first-order ΔΣ modulator 30 is provided instead of the DAC of FIG. 6. The first-order ΔΣ modulator 30 converts the N-bit output signal S28 into the 1-bit output signal S30 in synchronism with a clock signal whose frequency is $2^N$ times as high as that of the clock signal CLK. The first-order ΔΣ modulator 30 converts the N-bit output signal S28 into the 1-bit digital signal S30 in synchronism with the clock signal whose frequency is $2^N$ times as high as that of the clock signal CLK, which clarifies in the configuration of the first-order ΔΣ modulator 30 described later.

On the right side of FIG. 7A, the digital output S30 corresponding to the digital output S28 is illustrated. The N-bit digital output S28 synchronized with the clock signal CLK is converted to the 1-bit digital output S30 synchronized with the clock signal whose frequency is $2^N$ times as high as that of the clock signal CLK. The 1-bit digital output S30 substantially corresponds to a pulse-width modulated signal with respect to the N-bit digital output S28. For example, when the digital output S30 is "2", the digital output S30 is converted into two pulses. Similarly, when the digital output S30 is "1", "4", or "3", the digital output S30 is respectively converted into one pulse, four pulses, and three pulses.

That is, the first-order ΔΣ modulator 30 is a PWM circuit in which the N-bit digital output S28 is modulated to a pulse width on a time axis, instead of DAC. Further, the first-order ΔΣ modulator 30 is a digital circuit, which does not involve problems such as resolution depended on the power supply voltage like DAC, and the deterioration of accuracy due to the fluctuation of power supply or process variability, and which saves an area to be disposed.

Figure 8:
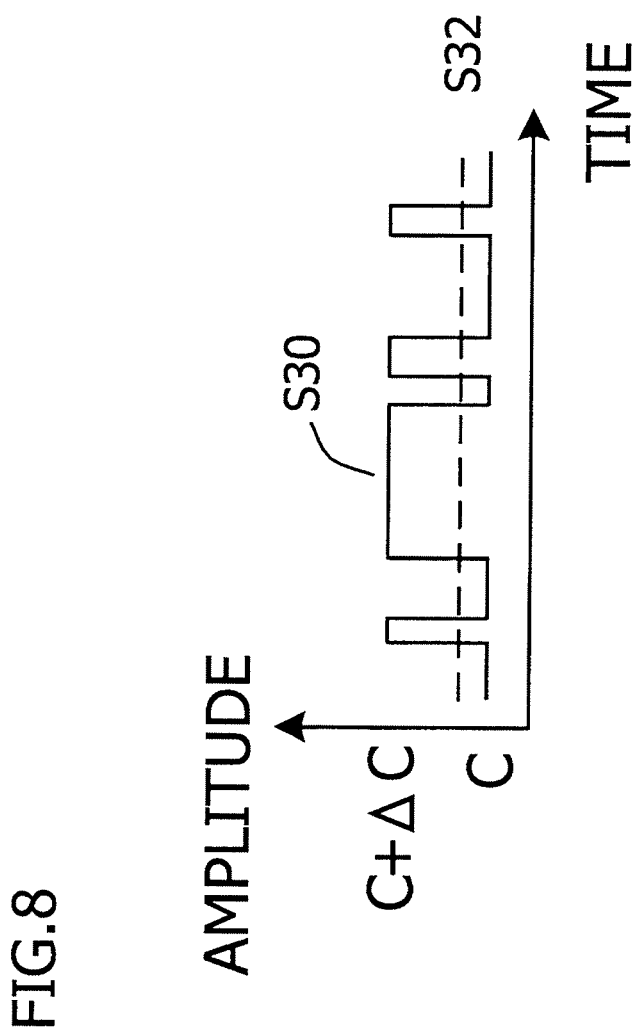
FIG. 8 is a graph to illustrate one example of a 1-bit digital output signal S30 of a first-order ΔΣ modulator 30.

FIG. 8 is a graph to illustrate one example of 1-bit digital output signal S30 of the first-order ΔΣ modulator 30. As is illustrated, the digital output signal S30 is a 1-bit digital signal of "0" or "1", wherein the digital value of the N-bit digital signal S28 is converted to a pulse width. The digital output signal S30 passes through the low pass filter 32, thereby generating an analog signal S32 corresponding to the pulse width. The analog signal S32 is applied to the electrode of the variable capacitor in the oscillator 20, and the capacitance value of the variable capacitor is controlled.

The descriptions above provides the details of the configuration of the high-order ΔΣ modulator 28 of FIG. 4, the first-order ΔΣ modulator 30, and the low pass filter 32. Next, the example of the configuration of the high-order ΔΣ modulator and the first-order ΔΣ modulator will be described below.

Figure 9:
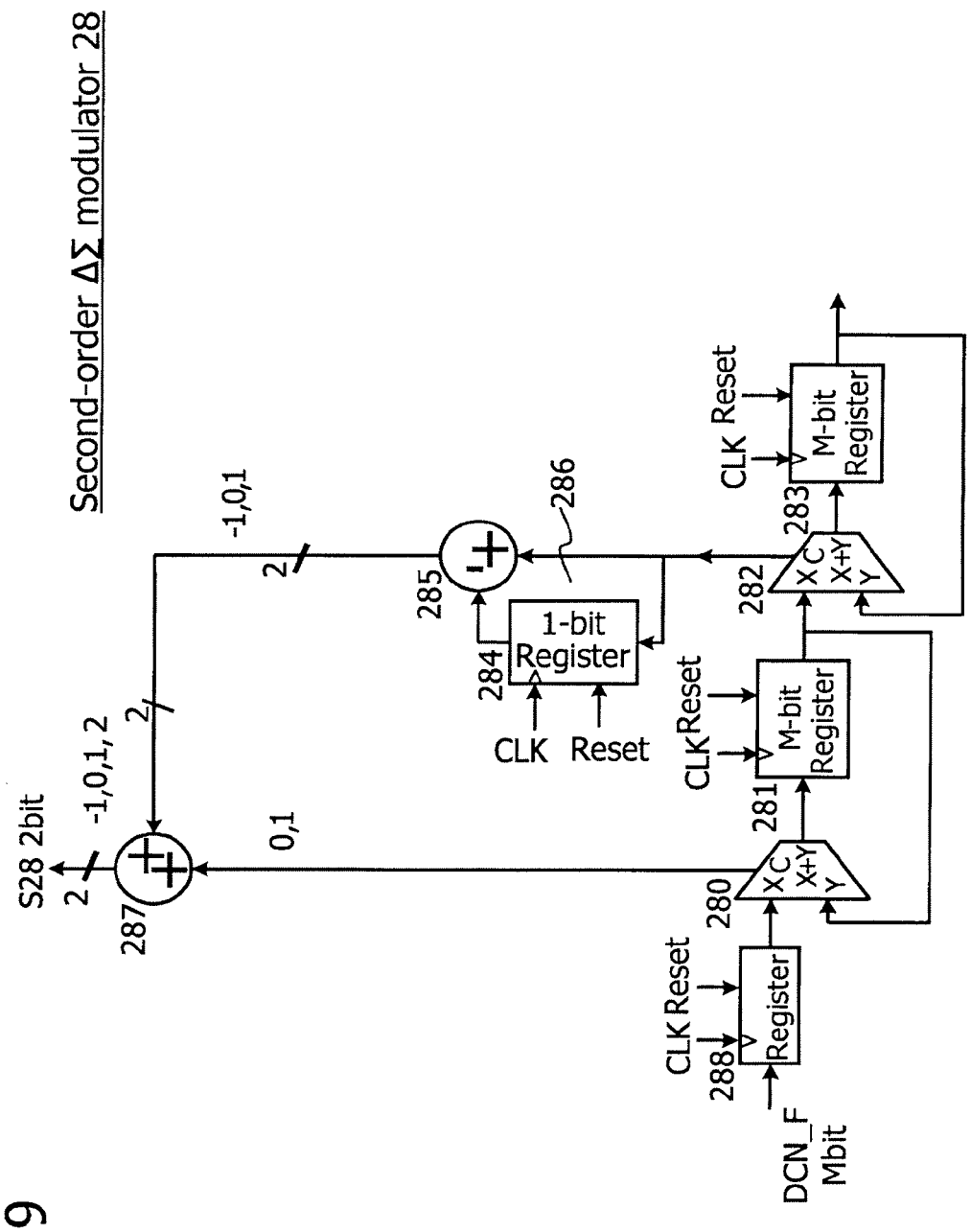
FIG. 9 is a configuration diagram of a second-order ΔΣ modulator illustrated as one example of a high-order ΔΣ modulator.

FIG. 9 is a configuration diagram of second-order ΔΣ modulator as one example of the high-order ΔΣ modulator. The ΔΣ modulator is MASH1-1 ΔΣ modulator. The second-order ΔΣ modulator 28 includes an input register 288 to which the M-bit digital control signal DCN_F for fine adjustment is inputted in synchronism with the clock signal CLK, a first adder 280, and a first register 281 to latch the added value (X+Y) of the first adder 280 in synchronism with the clock signal CLK. The added value to which one clock cycle is delayed by the first register 281 is fed back to the first adder 280 and added to the output signal of the input register 288 to which the input signal DCN_F is inputted.

Further, the second-order ΔΣ modulator 28 includes a second adder 282 and a second register 283 to latch the added value (X+Y) of the second adder 282 in synchronism with the clock signal CLK. The added value to which one clock cycle is delayed by the second register 283 is fed back to the second adder 282 and added to the output value of the first register 281. Moreover, the differential value of the carry signal C of the second adder 282 is generated by a differentiating circuit 286 constituted by the register 284 by which one cycle of the clock signal CLK is delayed and a subtractor 285. An adder 287 adds the carry signal (1 bit) of the first adder 280 and the differential value (1 bit+1) and outputs the 2-bit digital output signal S28.

The carry signal C of the first adder 280 is 1-bit signal of "1" or "0", and the differential value is (1-bit+1) signal of any one of "−1", "1" and "0". Adding the carry signal and the differential value is turned into the 2-bit digital output signal S28.

15-bit digital control signal DCN_F for fine adjustment is inputted to the second-order ΔΣ modulator 28, which generates the 2-bit digital output signal S28 that rapidly changes at random in synchronism with the clock signal CLK. The digital output signal S28 is the pseudorandom digital signal in which the quantization noise is low in the low-frequency bandwidth, as is illustrated in FIG. 5.

Figure 10A:
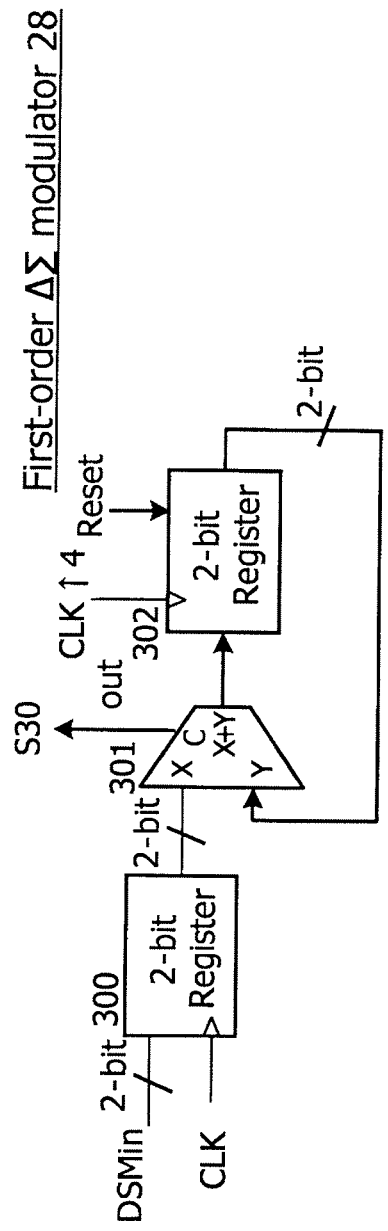
FIGS. 10A and 10B are diagrams to illustrate the configuration and operational waveforms of the first-order ΔΣ modulator 30.
Figure 10B:
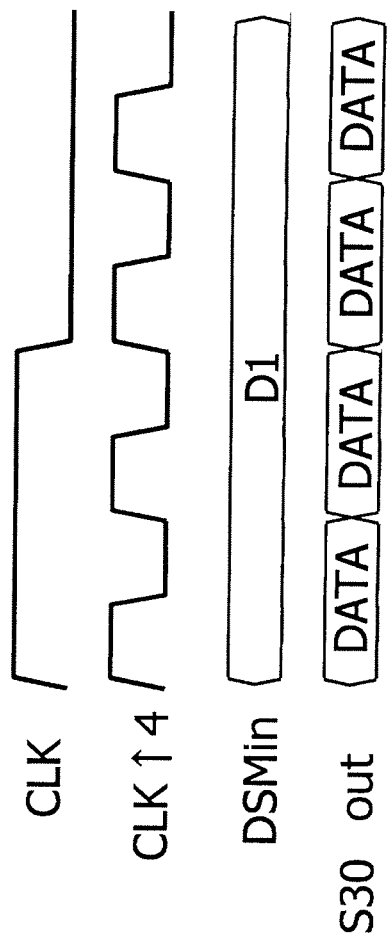
Figure 12B:
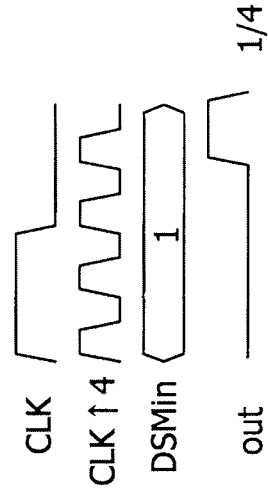
FIGS. 12A, 12B, 12C, and 12D are diagrams illustrating the operational waveforms of the first-order ΔΣ modulator 30.
Figure 12D:
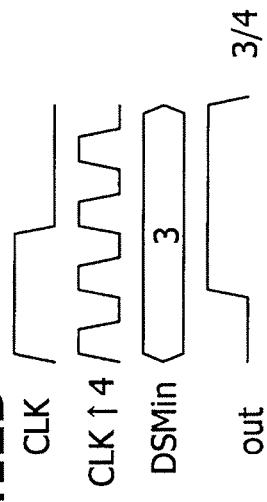
Figure 12A:
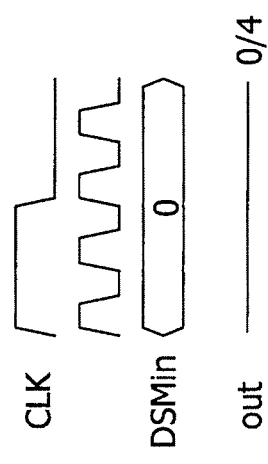
Figure 12C:
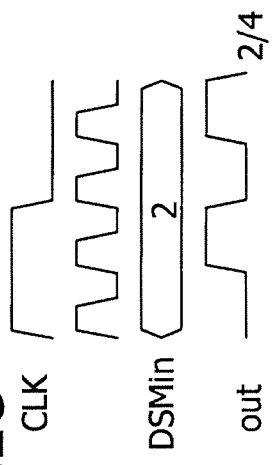
Figure 13B:
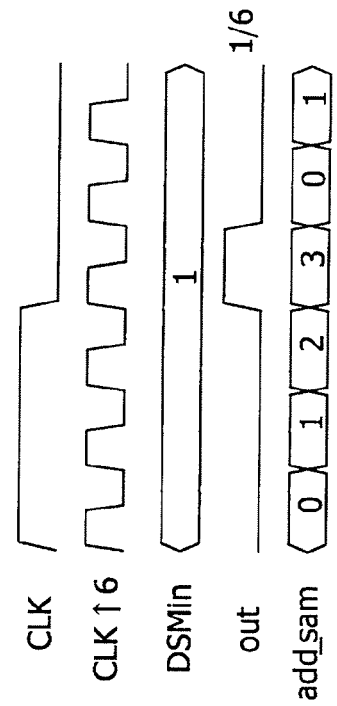
FIGS. 13A, 13B, 13C, and 13D are diagrams illustrating other operational waveforms of the first-order ΔΣ modulator 30.
Figure 13D:
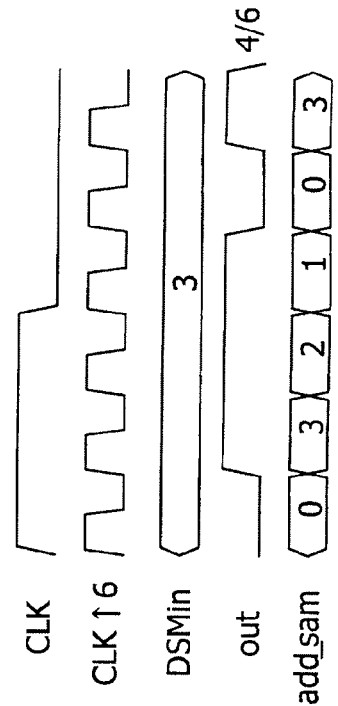
Figure 13A:
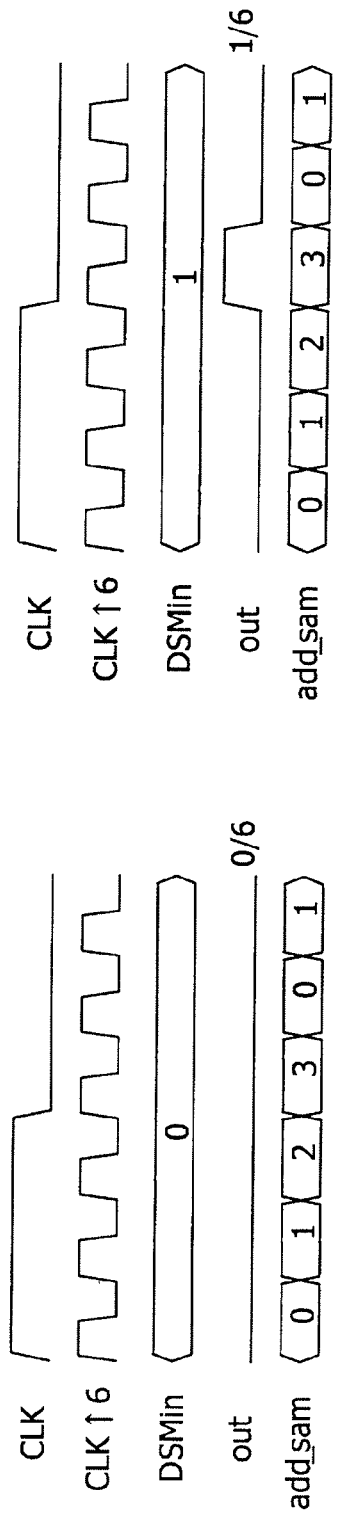
Figure 13C:
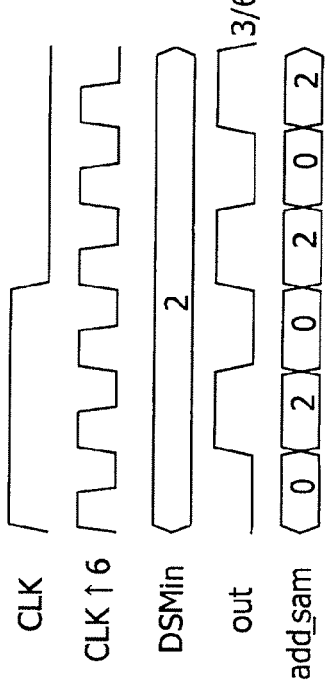

FIGS. 10A and 10B are diagrams to illustrate the configuration and operational waveforms of the first-order ΔΣ modulator 30. The digital input DSMin of the first-order ΔΣ modulator 30 corresponds to the 2-bit output signal from the second-order ΔΣ modulator 28 in FIG. 9. The first-order ΔΣ modulator 30 includes an input register 300 to latch the digital input DSMin in synchronism with the clock signal CLK, an adder 301, and a register 302 to latch and delay the added value (X+Y) of the adder 301 in synchronism with the clock signal whose frequency is four times as high as that of the clock signal CLK. The carry signal C of the adder 301 is turned into 1-bit digital output signal S30.

As is illustrated in the operational waveforms of FIG. 10B, the modulation signal S30 is generated by the adder 301 and the register 302 that serves as a delay circuit, in synchronism with a clock signal whose frequency is $2^2$ times (4 times) as high as that of the clock signal CLK as a reference. The output signal S30 (DATA in the diagram) is 1-bit digital signal of "0" or "1" and a high-speed 1-bit stream.

Presupposing that the number of bits of the digital input signal DSMin is N, it is preferable that the frequency of the clock signal of the first-order ΔΣ modulator 30 be $2^N$ times or $(m \times 2^N)$ times as high as the frequency of the reference clock signal CLK (m is an integer). However, preferably, m is set to a small value as much as possible, for example, set to "1", which provides a clock signal whose frequency is low. Selecting this frequency allows the output pattern of the digital output signal S30 of the first-order ΔΣ modulator 30 to form a uniform pulse train corresponding to the N-bit digital input signal DSMin for every one cycle of the reference clock signal CLK, that is, for every $2^N$ cycle of the synchronized clock signal of the delay register 302. This means that the first-order ΔΣ modulator 30 does not generate useless quantization noise and makes the most use of the noise shaping effect in FIG. 5.

FIGS. 11A, 11B, and 11C are a diagram, an operational waveform, and tables to illustrate the operation of the first-order ΔΣ modulator 30. Four cases are illustrated in tables in FIG. 11C. That is, four cases represent the operations of the first-order ΔΣ modulator 30 when the digital input signal DSMin is respectively "0", "1", "2", and "3", and an initial value of the register 302 is "0". (1) In the case of DSMin=0, the adder 301 all outputs "0" as the output out in cycles t1 to t4 of the clock signal whose frequency is four times as high as that of the clock signal CLK, and the pulse width is 0/4. (2) In the case of DSMin=1, the adder 301 outputs "1" in the cycle t4 and "0" in other cycles as the output out, and the pulse width is 1/4. (3) In the case of DSMin=2, the adder 301 outputs "1" in the cycles t2 and t4 as the output out, and the pulse width is 2/4. (4) In the case of DSMin=3, the adder 301 outputs "1" in the cycles t2, t3, and t4 as the output out, and the pulse width is 3/4.

FIGS. 12A, 12B, 12C, and 12D are diagrams illustrating the operational waveforms of the first-order ΔΣ modulator 30. Under the same condition as that of FIGS. 11A to 11C, FIGS. 12A to 12D illustrate a case where the frequency of the clock signal is $2^N$ times (=four times) as high as that of the reference clock signal CLK, and the initial value of the register 302 is "0". FIGS. 12A to 12D illustrate the operational waveforms corresponding to four tables of FIG. 11C. As is obvious from FIGS. 12A to 12D, a pulse width modulation output out having a pulse width corresponding to the value of the digital input DSMin is always generated with a same pattern.

However, when the initial value of the register 302 is not "0", although the pattern of the output out is the same waveform for every four clock cycle, but the pattern of the output out is different from those of FIG. 12. Accordingly, it is preferable that the register 302 be controlled in a manner that the initial value is always set to "0" by reset.

FIGS. 13A, 13B, 13C, and 13D are diagrams illustrating another operation of the first-order ΔΣ modulator 30. In this case, the frequency of the clock signal of the first-order ΔΣ modulator 30 does not satisfy the aforementioned condition that the frequency of the clock signal is $2^N$ times or ($m \times 2^N$) times as high as the frequency of the reference clock signal CLK. That is, in this case, the frequency of the clock signal is six times as high as that of the reference clock signal CLK. FIGS. 13A to 13D illustrate four examples (1) to (4) in the case of DSMin="0", "1", "2", and "3". (1) In the case of DSMin="0", the output out is all "0", and the pulse width of the output out is 0/6. (2) In the case of DSMin="1", the pulse width of the output out is 1/6. (3) In the case of DSMin="2", the pulse width of the output out is 3/6. (4) In the case of DSMin="3", the pulse width of the output out is 4/6.

Thus, at first glance, the pulse width of the output out does not correspond to the pulse width in accordance with the input DSMin. However, in the long term, the pulse width of the output out gradually corresponds to the pulse width in accordance with the input DSMin. Accordingly, when the frequency of the clock signal of the first-order ΔΣ modulator 30 does not satisfy the aforementioned condition that the frequency of the clock signal is $2^N$ times or ($m \times 2^N$) times as high as the frequency of the reference clock signal CLK, the pulse pattern of the output out changes for every cycle. As a result, there is a case where the noise shaping effect illustrated in FIG. 5 is diminished.

Figure 14:
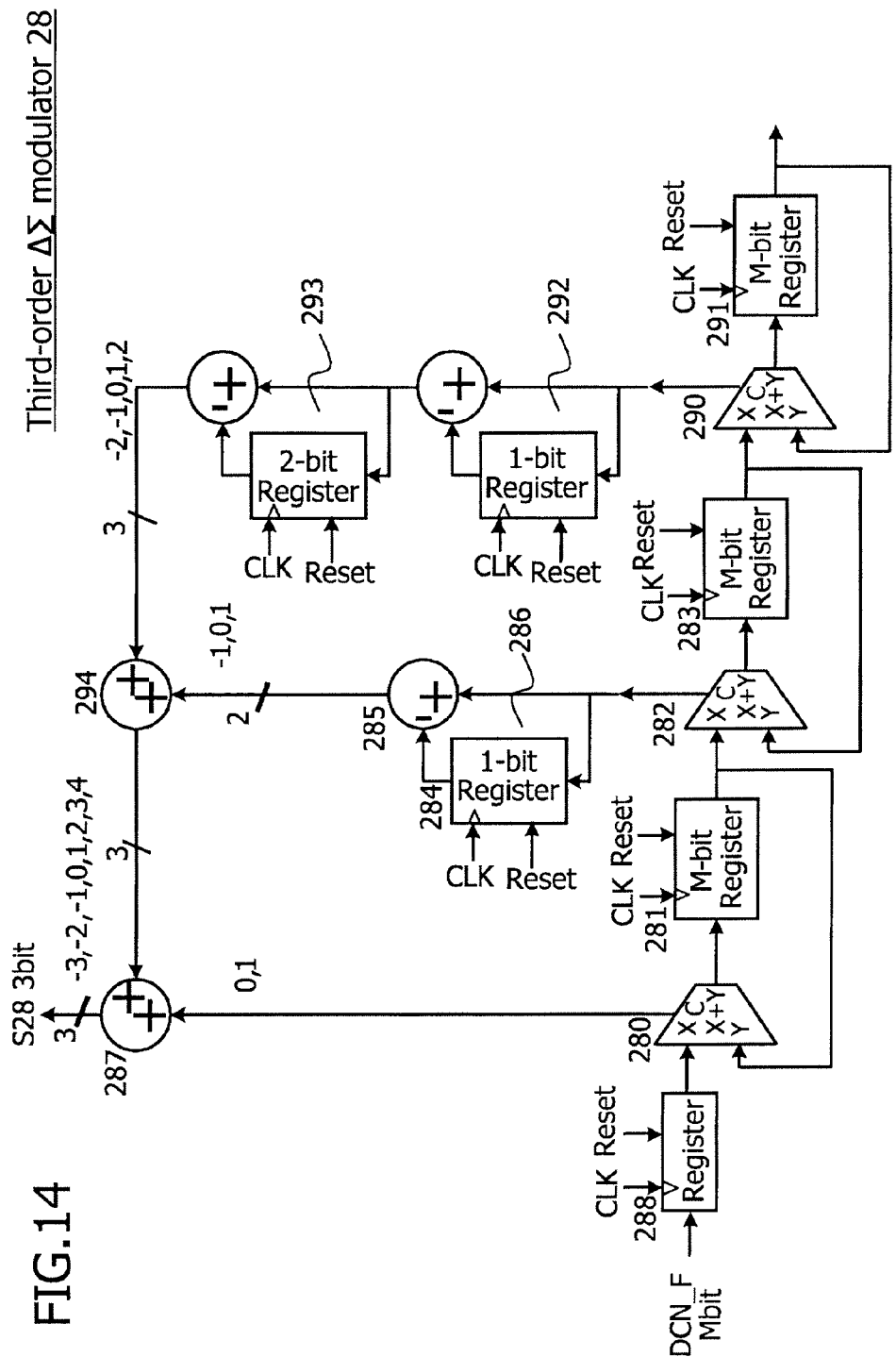
FIG. 14 is a configuration diagram of a third-order ΔΣ modulator 28 in the digitally controlled oscillator of the embodiment of the present invention.
Figure 15:
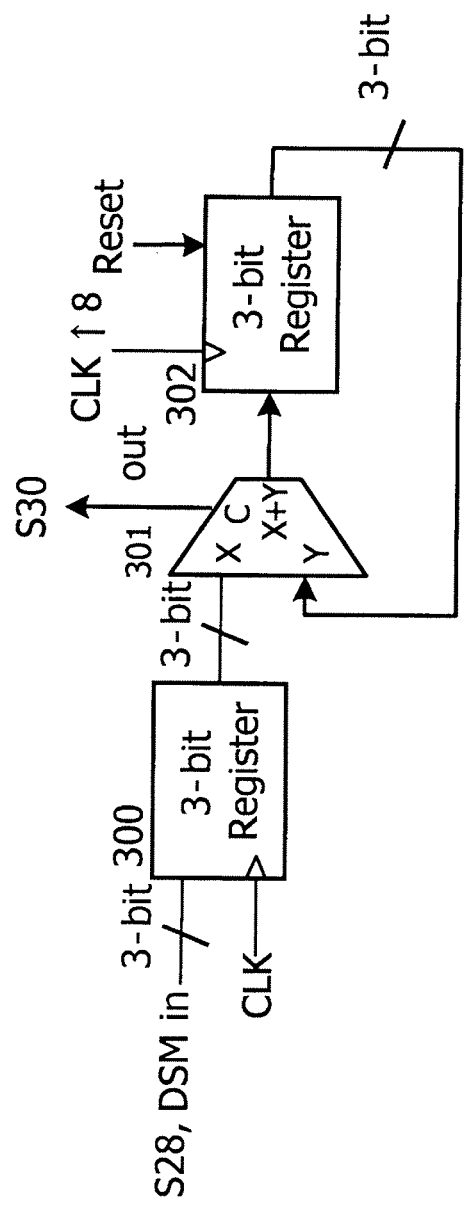
FIG. 15 is a configuration diagram of the first-order ΔΣ modulator 30 in the digitally controlled oscillator of the embodiment of the present invention.

FIG. 14 is a configuration diagram of the third-order ΔΣ modulator 28 in the digitally controlled oscillator of the embodiment of the present invention. FIG. 15 is a configuration diagram of the first-order ΔΣ modulator 30 in the digitally controlled oscillator of the embodiment of the present invention. The high-order ΔΣ modulator 28 and the first-order ΔΣ modulator 30 in the digitally controlled oscillator illustrated in FIG. 4 are respectively configured to be the second-order ΔΣ modulator 28 and the first-order ΔΣ modulator 30 in FIGS. 9 and 10. In contrast, the high-order ΔΣ modulator 28 and the first-order ΔΣ modulator 30 in the digitally controlled oscillator illustrated in FIG. 4 are respectively configured to be the third-order ΔΣ modulator 28 and the first-order ΔΣ modulator 30 in FIGS. 14 and 15.

In addition to the configuration of the second-order ΔΣ modulator 28 in FIG. 9, the third-order ΔΣ modulator 28 in FIG. 14 includes a third adder 290, a delay register 291 to latch the added value (X+Y) of the third adder 290 in synchronism with the clock signal CLK, differentiating circuits 292 and 293 to differentiate the carry signal of the third adder 290 two times, and an adder 294. The carry output of the first adder 280 is 1-bit signal, and the output of the differentiating circuit 286 is (1 bit+1) signal, and the output of the differentiating circuit 293 is (2 bit+1) signal, and the output S28 of the adder 287 is a 3-bit signal.

The 3-bit output signal S28 of the third-order ΔΣ modulator 28 is inputted to the first-order ΔΣ modulator 30 in FIG. 15, which outputs 1-bit pseudorandom digital output signal S30. The first-order ΔΣ modulator 30 in FIG. 15, which is similar to the first-order ΔΣ modulator 30 in FIG. 10, includes an input register 300, an adder 301, and one-clock delay register 302 and outputs the output out (S30), which is the carry signal C of the adder 301. However, three bits are inputted to each register, so that each register to be constituted has three bits. Further, it is preferable that the frequency of the clock signal in the first-order ΔΣ modulator 30 be high-speed clock signal whose frequency is 8 times (=$2^3$) as high as that of the reference clock signal CLK, for the reason described above.

Second Embodiment

Figure 16:
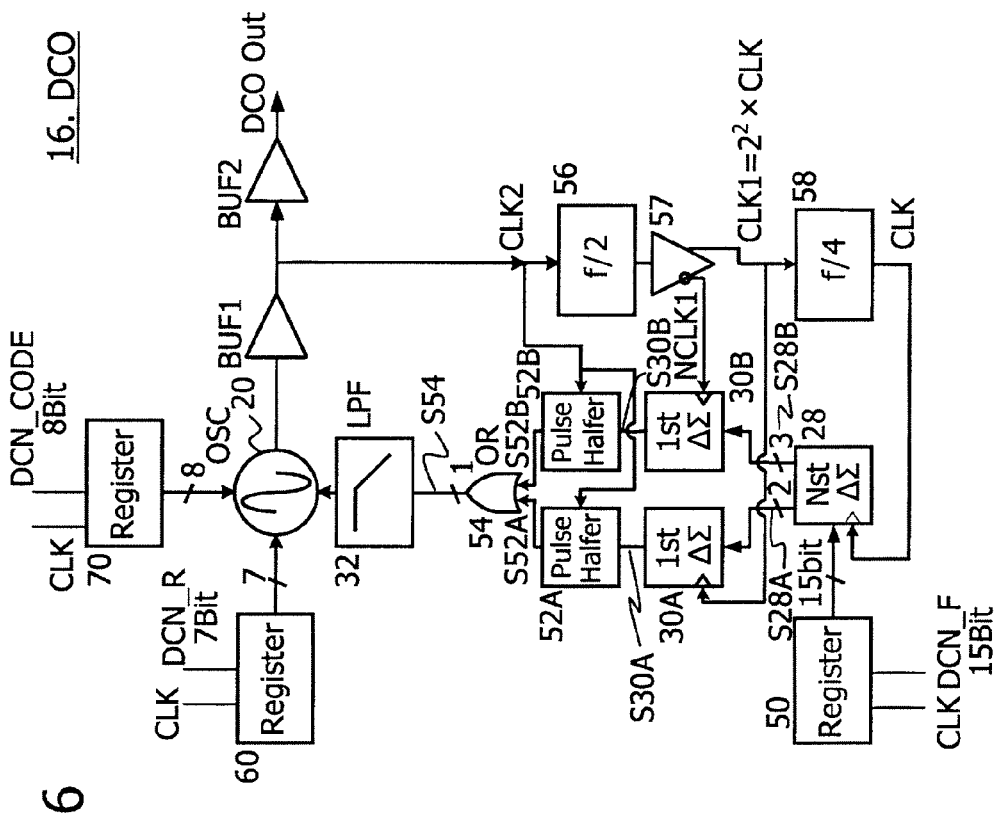
FIG. 16 is a configuration diagram of the digitally controlled oscillator of a second embodiment of the present invention.

FIG. 16 is a configuration diagram of the digitally controlled oscillator of the second embodiment of the present invention. The high-order ΔΣ modulator 28 described in FIGS. 14 and 15 is third-order, which provides a 3-bit pseudorandom digital output signal. As a result, the frequency of the clock signal in the secondary-stage first-order ΔΣ modulator 30 is $2^3$ times as high as that of the reference clock signal CLK. It is preferable that the high-order ΔΣ modulator 28 be a modulator that is higher in order as much as possible. This is because the higher-order ΔΣ modulator reduces the quantization noise in the low-frequency bandwidth as described in FIG. 5 and generates output having higher resolution. However, the higher in order the high-order ΔΣ modulator is, the higher the frequency of the clock signal in the secondary-stage first-order ΔΣ modulator 30 becomes.

Accordingly, as is illustrated in FIG. 16, in the digitally controlled oscillator of the second embodiment, the high-order ΔΣ modulator 28 generates a plurality of separated low-bit outputs S28A and S28B, and first-order ΔΣ modulators 30A and 30B pulse-width modulate each low-bit output. Further, pulse-width half-reduction circuits 52A and 52B halve the pulse width of the outputs S30A and S30B of the first-order ΔΣ modulators 30A and 30B, and an OR gate 54 synthesizes the signals whose pulse widths are halved. A synthesized signal S54 is inputted to the low pass filter 32.

It is noted that the relation between the number of bits of the output signal that is not separated by the high-order ΔΣ modulator and the number of bits of the output signals that are separated into a plurality by the high-order ΔΣ modulator is such that the separated output signal may be an output signal whose number of bits is less than the number of bits of the non-separated output signal by one bit or more, or an output signal whose number of bits is less than the number of bits of the non-separated output signal by one bit or more, plus one (+1).

For example, in the case where the high-order ΔΣ modulator 28 is the third-order ΔΣ modulator, the non-separated digital output is 3 bits. In the example of FIG. 16, two separated low-bit outputs S28A and S28B, which are respectively 2 bits and 3 bits, are outputted. Further, the 3-bit output S28B is (2 bit+1) signal made up of five types of data, and the most significant bit corresponding to (+1) is provided to the adder in the first-order ΔΣ modulators as carry-in. Accordingly, both first-order ΔΣ modulators substantially only have to modulate 2-bit input, thereby the control clock signal is $2^2$ times as high as that of the reference clock signal CLK. Accordingly, a lower-frequency control clock signal is realized, compared with the case where a 3-bit signal is inputted to the first-order ΔΣ modulators and the frequency of the control clock signal is $2^3$ times as high as that of the reference clock signal CLK.

The digitally controlled oscillator DCO in FIG. 16 includes an input register 50 to latch the 15-bit digital control signal DCN_F for fine adjustment, an input register 60 to latch the 7-bit digital control signal DCN_R for rough adjustment, and an input register 70 to latch the 8-bit control code DCN_CODE. The control signals of the input registers 60 and 70 are inputted to the capacitor array in the oscillator 20. The oscillation output of the oscillator 20 is outputted as an oscillation output DCO Out via two buffers BUF1 and BUF2.

The output clock signal CLK2 of the buffer BUF1 is provided as the control clock signal of the pulse-width half-reduction circuits 52A and 52B. The output clock signal CLK2 is divided in half by a divider 56, and control clock signals CLK1 and NCLK1 are generated by an inverting-and-non-inverting buffer 57. The control clock signals CLK1 and NCLK1 are inputted to the first-order ΔΣ modulators 30A and 30B as a control clock signal. Further, a divider 58 divides the control clock signal CLK1 to one fourth and generates the reference clock signal CLK, which is supplied to the high-order ΔΣ modulator 28.

Figure 17:
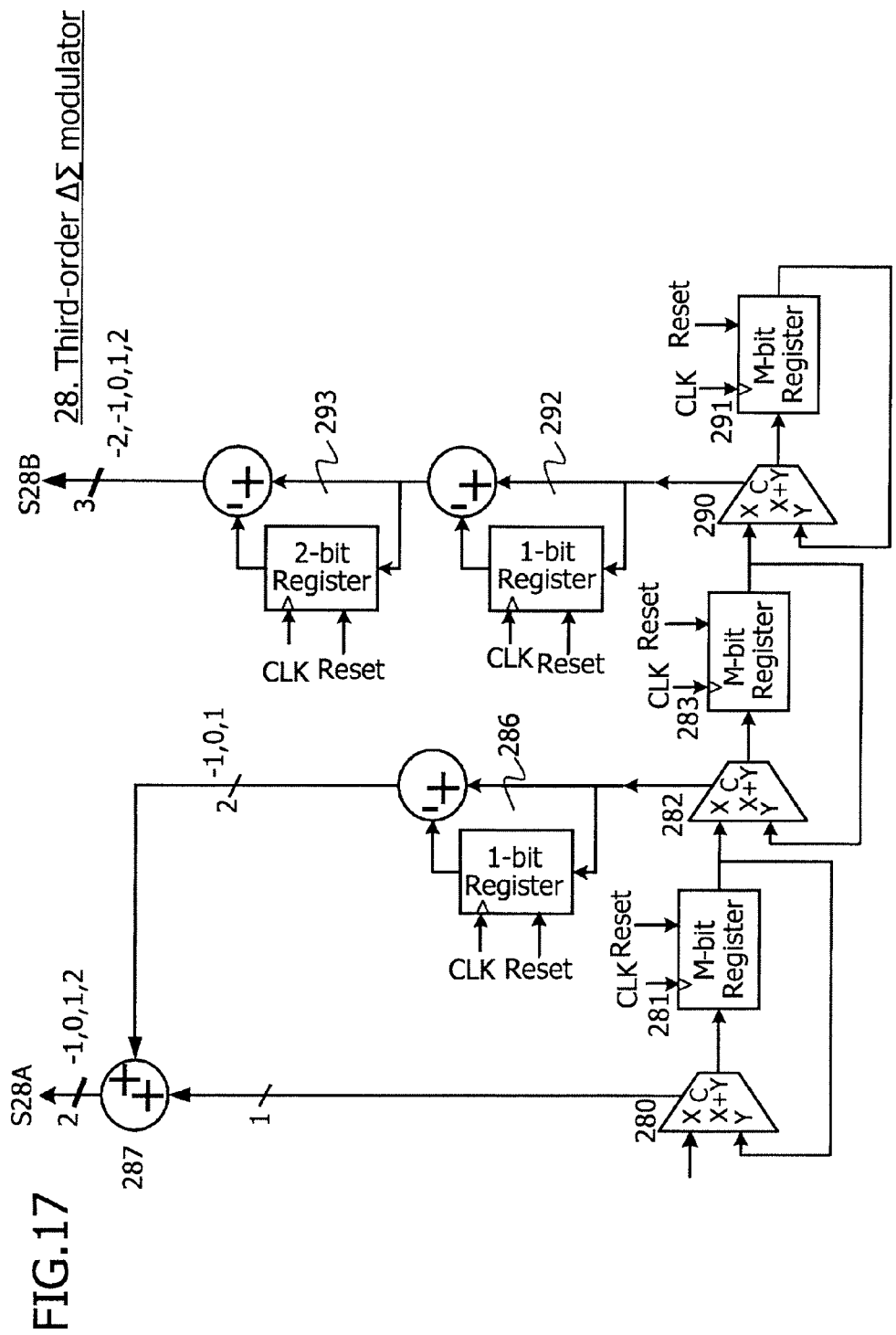
FIG. 17 is a configuration diagram of the high-order ΔΣ modulator 28 of the digitally controlled oscillator of the second embodiment of the present invention, illustrated as one example.

FIG. 17 is a configuration diagram of the high-order ΔΣ modulator 28 of the digitally controlled oscillator of the second embodiment of the present invention, illustrated as one example. FIG. 17 illustrates the third-order ΔΣ modulator. Compared with the third-order ΔΣ modulator illustrated in FIG. 14, it is obvious that the carry signal C of the first adder 280 and the output of the differentiating circuit 286 are added by the adder 287, which outputs a first low-bit output S28A, and the output of the differentiating circuit 293 is directly outputted as a second low-bit output S28B.

With regards to the first low-bit output S28A, the output of the differentiating circuit 286 is (1 bit+1) signal of "−1, 0, 1", so that the output S28A of the adder 287 is the 2-bit signal of "−1, 0, 1, 2". Similarly, with regards to the second low-bit output S28B, the output S28B of the differentiating circuit 293 is (2 bits+1) signal of "−2, −1, 0, 1, 2", which is a 3-bit signal, but it may be constituted that a 2-bit signal is inputted to the secondary-stage first-order ΔΣ modulator 30B.

Figure 18:
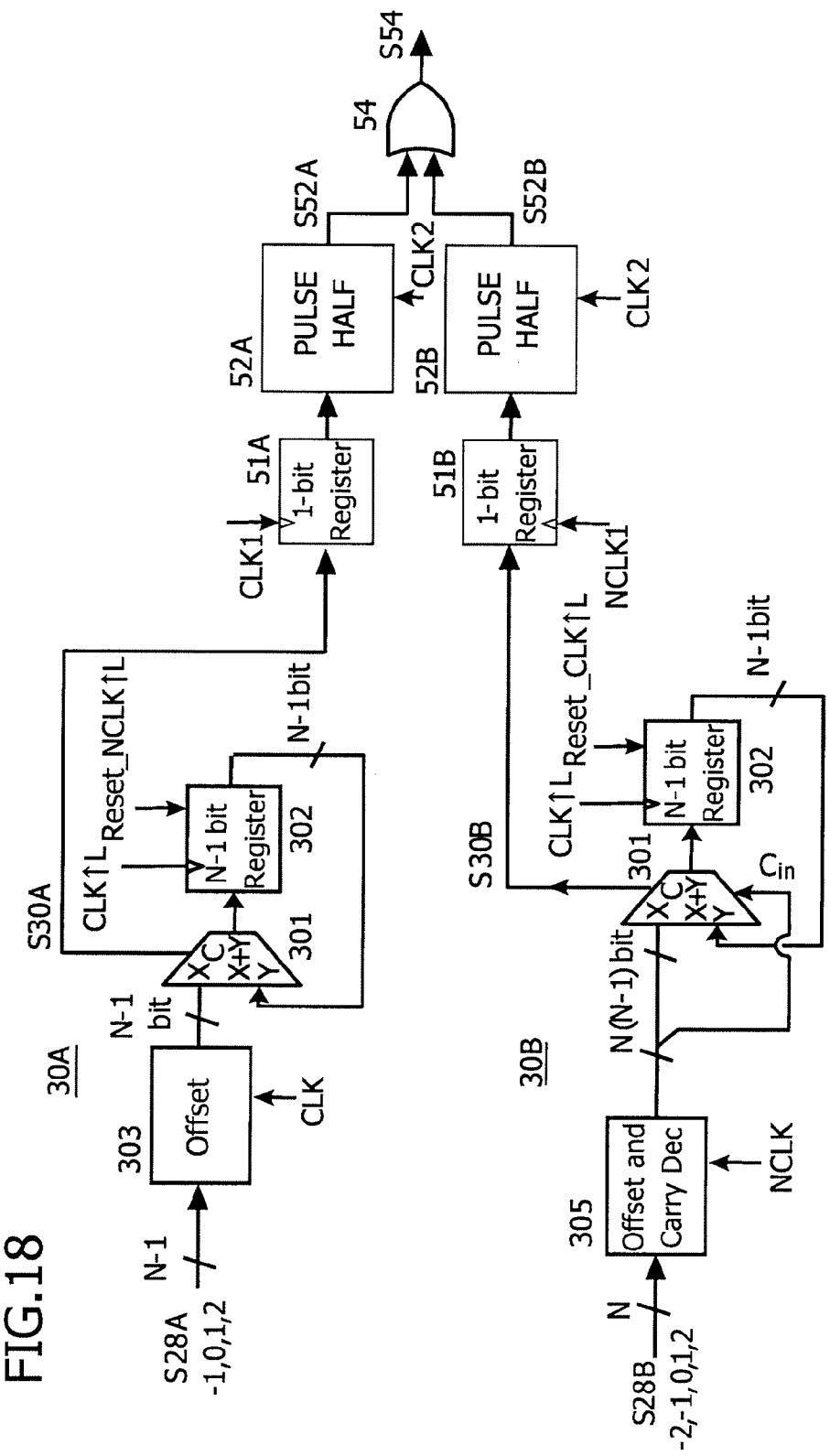
FIG. 18 is a configuration circuit of the first-order ΔΣ modulator, a pulse-width half-reduction circuit, and an OR gate of the digitally controlled oscillator in FIG. 16.

FIG. 18 is a configuration circuit of the first-order ΔΣ modulator, the pulse-width half-reduction circuit, and the OR gate of the digitally controlled oscillator in FIG. 16. FIG. 18 illustrates the configuration circuit of the first-order ΔΣ modulators 30A and 30B, registers 51A and 51B, the pulse-width half-reduction circuits 52A and 52B, and the OR gate 54.

The digital signal S28A of "−1, 0, 1, 2" is inputted to the first-order ΔΣ modulator 30A and converted into the 2-bit signal of "0, 1, 2, 3" by an offset circuit 303 and inputted to the adder 301. Apart from this, the other configuration is similar to that of the aforementioned first-order ΔΣ modulator. The first-order ΔΣ modulators 30A operates in synchronism with the clock signal CLK1 whose frequency is four times ($=2^2$ times) as high as that of the reference clock signal CLK and generates the output signal S30A.

The 3-bit digital signal S28B of "−2, −1, 0, 1, 2" is inputted to the first-order ΔΣ modulator 30B and converted into a 3-bit (2 bits+1) digital signal of "0, 1, 2, 3, 4" by an offset carry decoder circuit 305, and the most significant bit MSB of the 3-bit digital signal is inputted to a carry-in terminal of the adder 301 as a carry-in signal Cin. Subsequently, the rest of 2-bit digital signal of "0, 1, 2, 3" is inputted to the X terminal of the adder 301. Accordingly, the first-order ΔΣ modulator 30B substantially serves as the 2-bit first-order ΔΣ modulator, and the frequency of the clock signal NCLK1 is four times ($=2^2$ times) as high as that of the reference clock signal CLK.

Figure 19A:
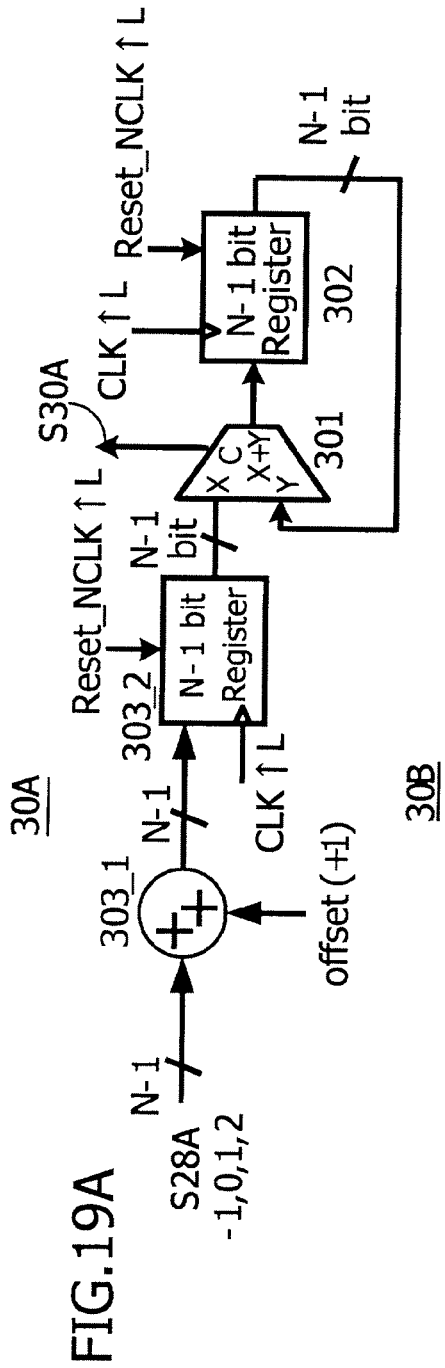
FIGS. 19A and 19B are configuration circuits of the first-order ΔΣ modulators in FIG. 18.
Figure 19B:
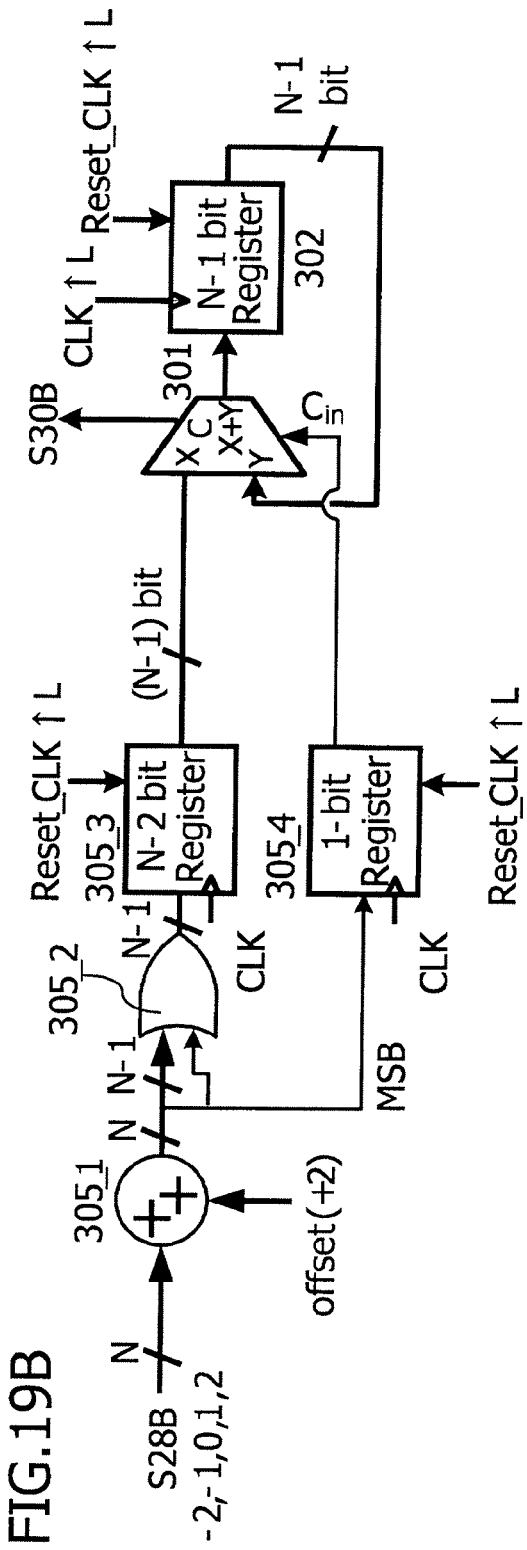

As is described above, both first-order ΔΣ modulators 30A and 30B substantially operate in the same way that the 2-bit digital signal from the third-order ΔΣ modulator 28 is inputted FIGS. 19A and 19B are configuration circuits of the first-order ΔΣ modulators in FIG. 18. FIGS. 19A and 19B illustrate the detailed configuration of the offset circuit 303 and the offset carry decoder circuit 305 of both first-order ΔΣ modulators 30A and 30B. The offset circuit 303 is constituted by an adder 303_1 configured to add an offset value +1 to the input signal S28A, and a register 303_2. The offset carry decoder circuit 305 is constituted by an adder 305_1 configured to add an offset value +2 to the input signal S28B, a decoder 305_2 configured to decode the input signal in such a manner as to set MSB=1 and "11" in the case where the input signal is "4=100", and registers 305_3 and 305_4. The register 305_3 outputs low-order 2 bits to the X terminal of the adder 301. The register 305_4 outputs the most significant bit MSB to the carry-in terminal Cin of the adder 301.

Returning to FIG. 18, the outputs S30A and 530B of both first-order ΔΣ modulators 30A and 30B are latched by the registers 51A and 51B in synchronism with the clock signal CLK1 and an inverting clock signal NCLK1, which is inverted with respect to the clock signal CLK1, and outputted to the pulse-width half-reduction circuits 52A and 52B. That is, the phase of the output S30B is delayed 180 degrees by the register 51B.

FIGS. 20A, 20B, and 20C are diagrams illustrating the configuration and operation of the pulse-width half-reduction circuits 52A and 52B. The pulse-width half-reduction circuits 52A and 52B include an inverter 520, a NOR gate 522, and a D flip-flop 521. Input data DATA_A is inverted by the inverter 520 and the NOR gate 522, so that the logic of the input data DATA_A is equal to that of output data HDATA_A. A 1/2 frequency divider is constituted by the NOR gate 522 and the D flip-flop 521. When the data output Q of the D flip-flop 521 is "H", the NOR gate 522 and the D flip-flop 521 operates as the divider, and when the data output Q is "L", the NOR gate 522 and the D flip-flop 521 do not operate as the divider. The divider synthesizes with the clock signal whose frequency is twice as high as that of the reference clock signal CLK, thereby generating the output data HDATA_A to which the cycle of the input data DATA_A is divided in half.

As a result, the input data DATA_A and the input data DATA_B, which are originally delayed in a half cycle, are respectively converted into output data whose pulse width is the half of the input data. The output data is inputted to the OR gate 54, thereby generating a pulse train signal in which the output data HDATA_A and HDATA_B, whose pulse width is the half of the input data, is synthesized.

Figure 21:
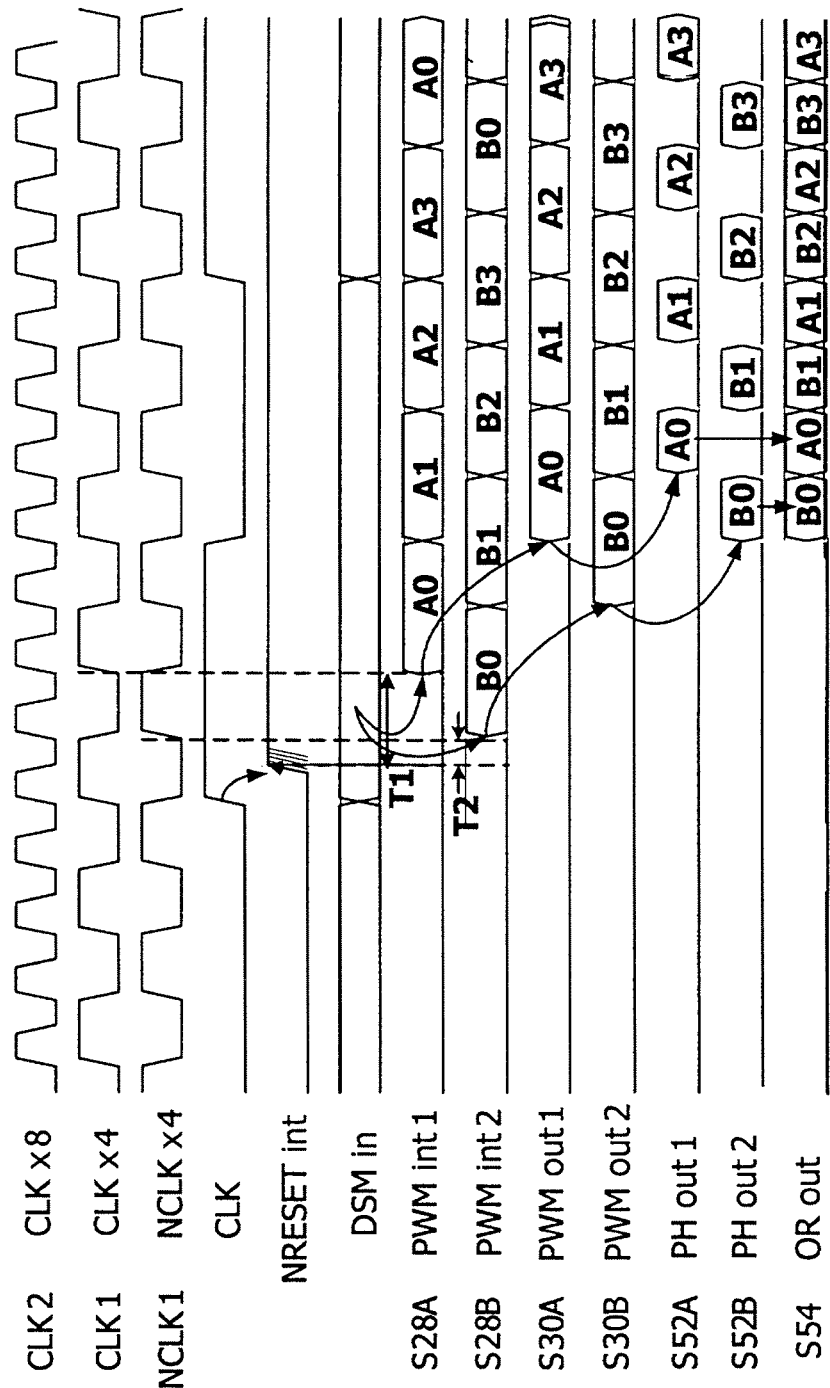
FIG. 21 is a waveform diagram illustrating the operation of the circuit in FIG. 18.

FIG. 21 is a waveform diagram to illustrate the operation of the circuit in FIG. 18. The frequency of the clock signals CLK1 and NCLK1 inputted to the first-order ΔΣ modulators 30A and 30B is 4 times as high as that of the reference clock signal CLK. Further, the frequency of the clock signal CLK2 inputted to the pulse-width half-reduction circuits 52A and 52B is 8 times as high as that of the reference clock signal CLK. In both first-order ΔΣ modulators 30A and 30B, signals are inputted and modulated respectively in synchronism with the clock signals CLK1 and NCLK1, the phases of the outputs of the first-order ΔΣ modulators 30A and 30B is shifted 180 degrees. Further, the signals S52A and S52B, whose pulse width is the half of pulse width of the modulation outputs S30A and S30B, are synthesized by the OR gate 54. Accordingly, a pulse train including a pulse width corresponding to the 3-bit output of the third-order ΔΣ modulators 28 is outputted from the OR gate 54.

Modification 1 of Second Embodiment

In the embodiment described above, the case has been described where the high-order ΔΣ modulator is the third-order ΔΣ modulator. However, the high-order ΔΣ modulator may be fourth-order or higher. Hereinafter, a modification 1 will be described where the fourth-order ΔΣ modulator is used as the high-order ΔΣ modulator.

Figure 22:
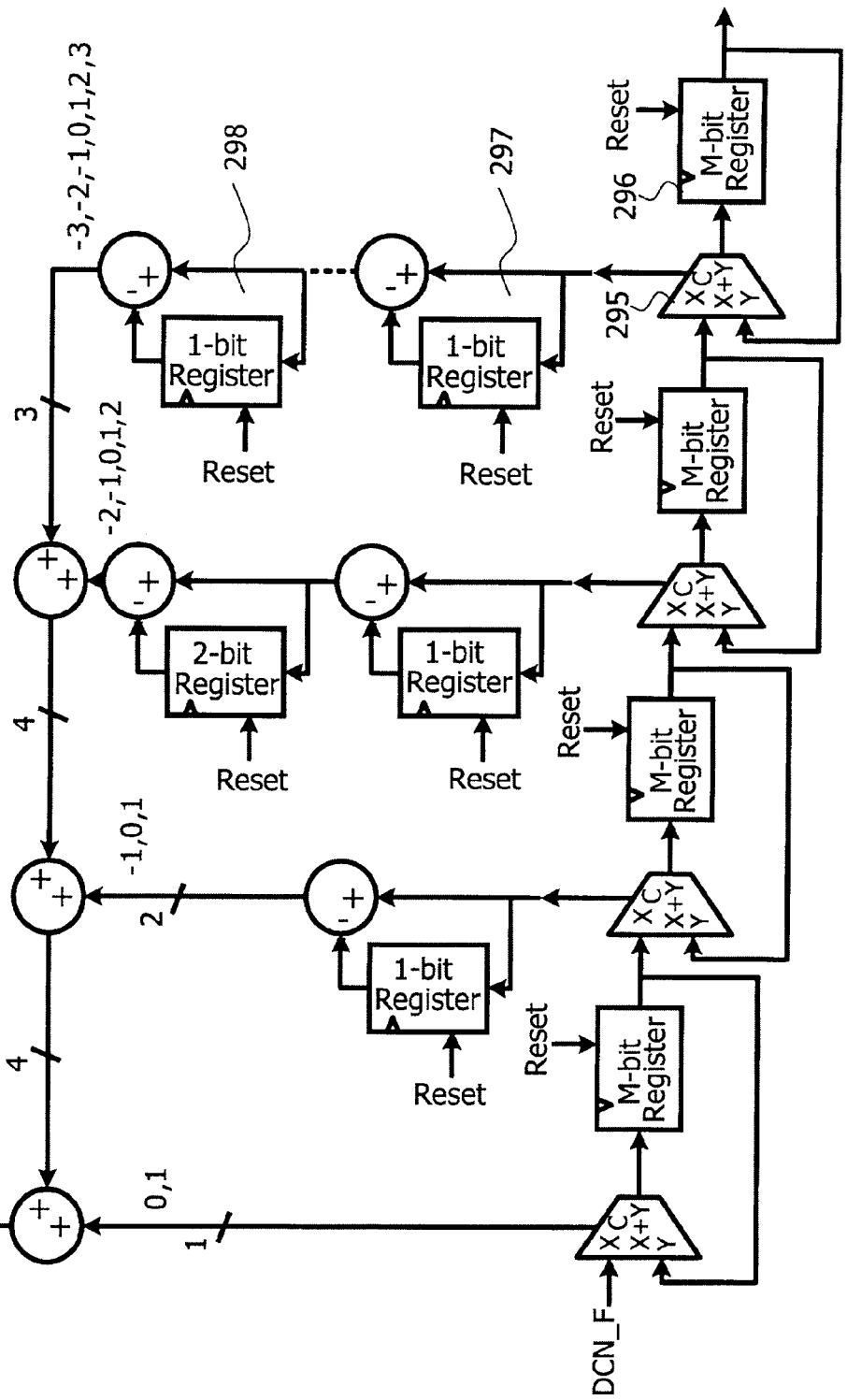
FIG. 22 is a configuration circuit of a fourth-order ΔΣ modulator.

FIG. 22 is a configuration circuit of the fourth-order ΔΣ modulator. The fourth-order ΔΣ modulator includes a fourth-order adder 295, a delay register 296, and differentiating circuits 297 and 298, in addition to the third-order ΔΣ modulator in FIG. 14. The output S28 of the fourth-order ΔΣ modulator is 4-bit digital signal.

Figure 23:
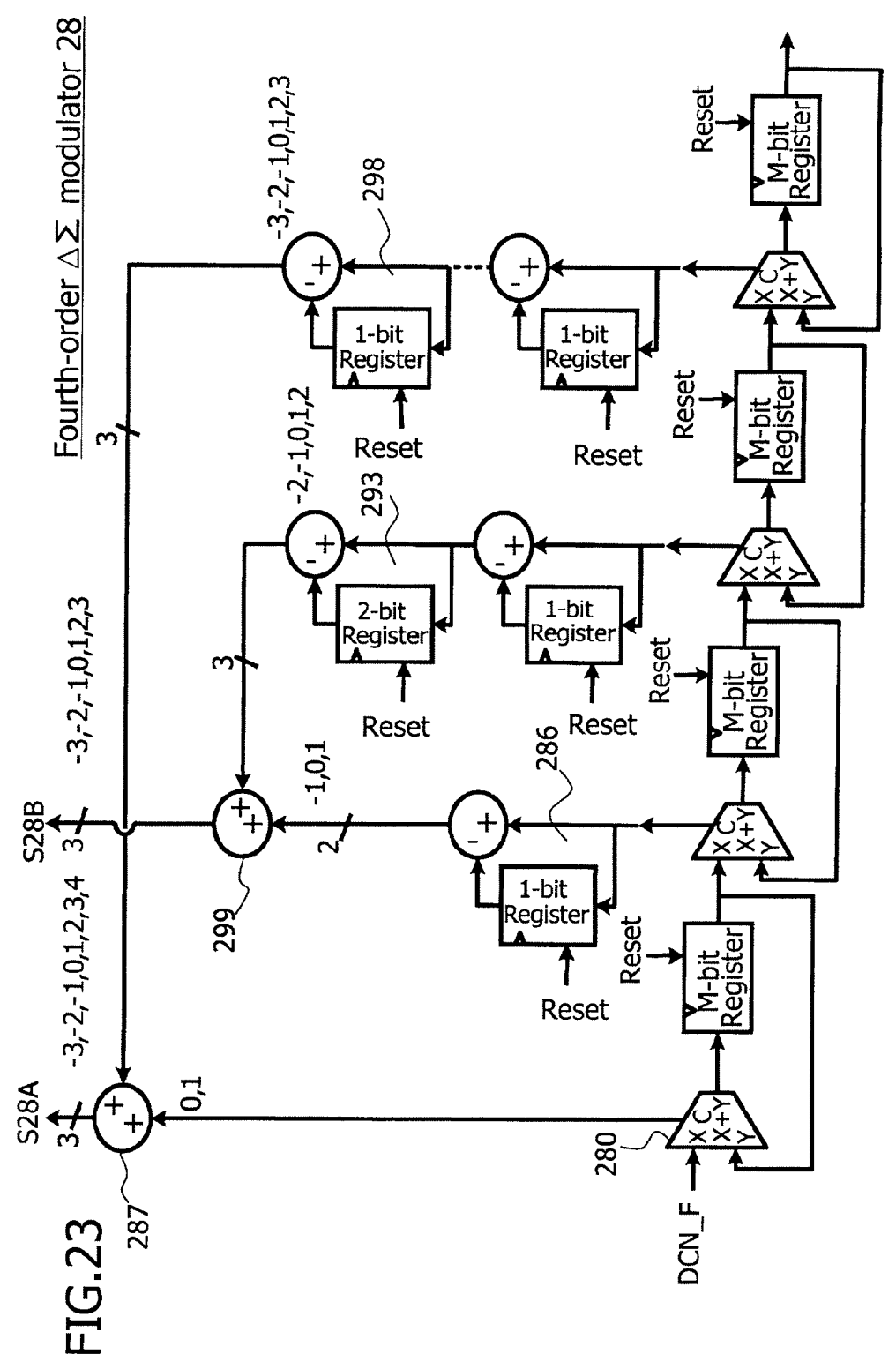

FIG. 23 is a configuration circuit of the fourth-order ΔΣ modulator of the digitally controlled oscillator of the embodiment of the present invention. In the fourth-order ΔΣ modulator 28, the carry signal of the first-order first adder 280 and the output signal of the fourth-stage differentiating circuit 298 are added by the adder 287 and outputted as a first digital output S28A. The output of the second-order differentiating circuit 286 and the output of the third-order differentiating circuit 293 are added by the adder 299 and outputted as a second digital output S28B. Since the ΔΣ modulator is fourth-order, both digital outputs S28A and S28B are a 3-bit digital signal.

The two 3-bit digital outputs S28A and S28B are inputted to the two first-order ΔΣ modulators 30A and 30B, pulse-width modulated, halved in terms of the pulse width, and synthesized. In this case, the frequency of the clock signal of the first-order ΔΣ modulators 30A and 30B is $2^3$ times as high as that of the reference clock signal CLK. However, the clock signal is considered to be a low-speed clock signal, compared with the case where 4-bit output is inputted and the frequency of the clock signal is $2^4$ times as high as that of the reference clock signal CLK as illustrated in FIG. 22.

Modification 2 of Second Embodiment

In the embodiment described above, two low-bit digital outputs are outputted from the high-order ΔΣ modulator, pulse-width modulated and synthesized by the two first-order ΔΣ modulators. However, it may be such that the high-order ΔΣ modulator outputs four low-bit digital outputs, each of which is pulse-width modulated and synthesized by the four first-order ΔΣ modulators. Hereinafter, a modification 2 will be described.

Figure 24:
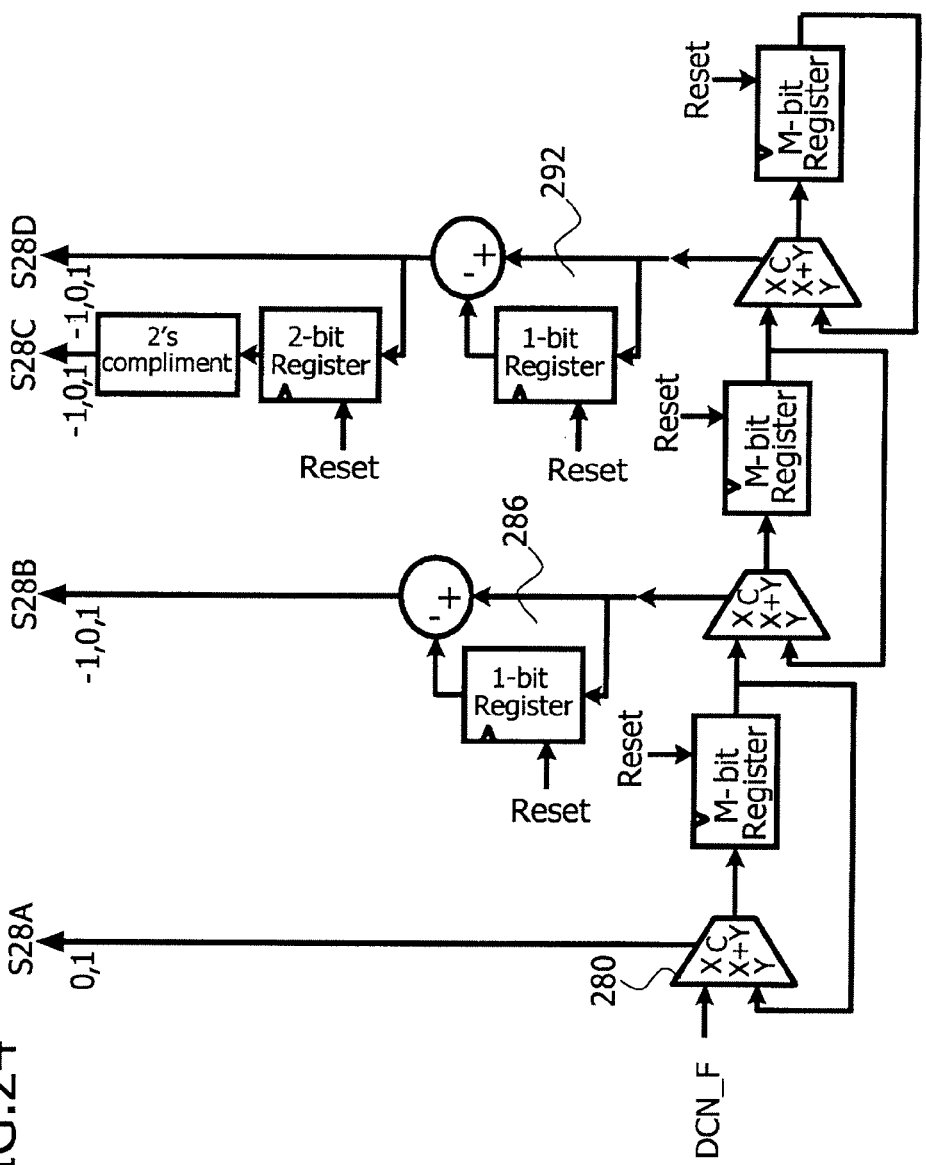
FIG. 24 is a configuration diagram of the third-order ΔΣ modulator.

FIG. 24 is a configuration diagram of the third-order ΔΣ modulator. The third-order ΔΣ modulator 28 outputs 1-bit output S28A, (1 bit+1) outputs S28B, S28C, and S28D. These outputs are inputted to the first-order ΔΣ modulators 30A and 30B and pulse-width modulated, illustrated in FIGS. 19A and 19B. However, the third-order ΔΣ modulator 28 is different from the first-order ΔΣ modulator in FIGS. 19A and 19B in terms of the number of bits of the input signal.

Figure 25:
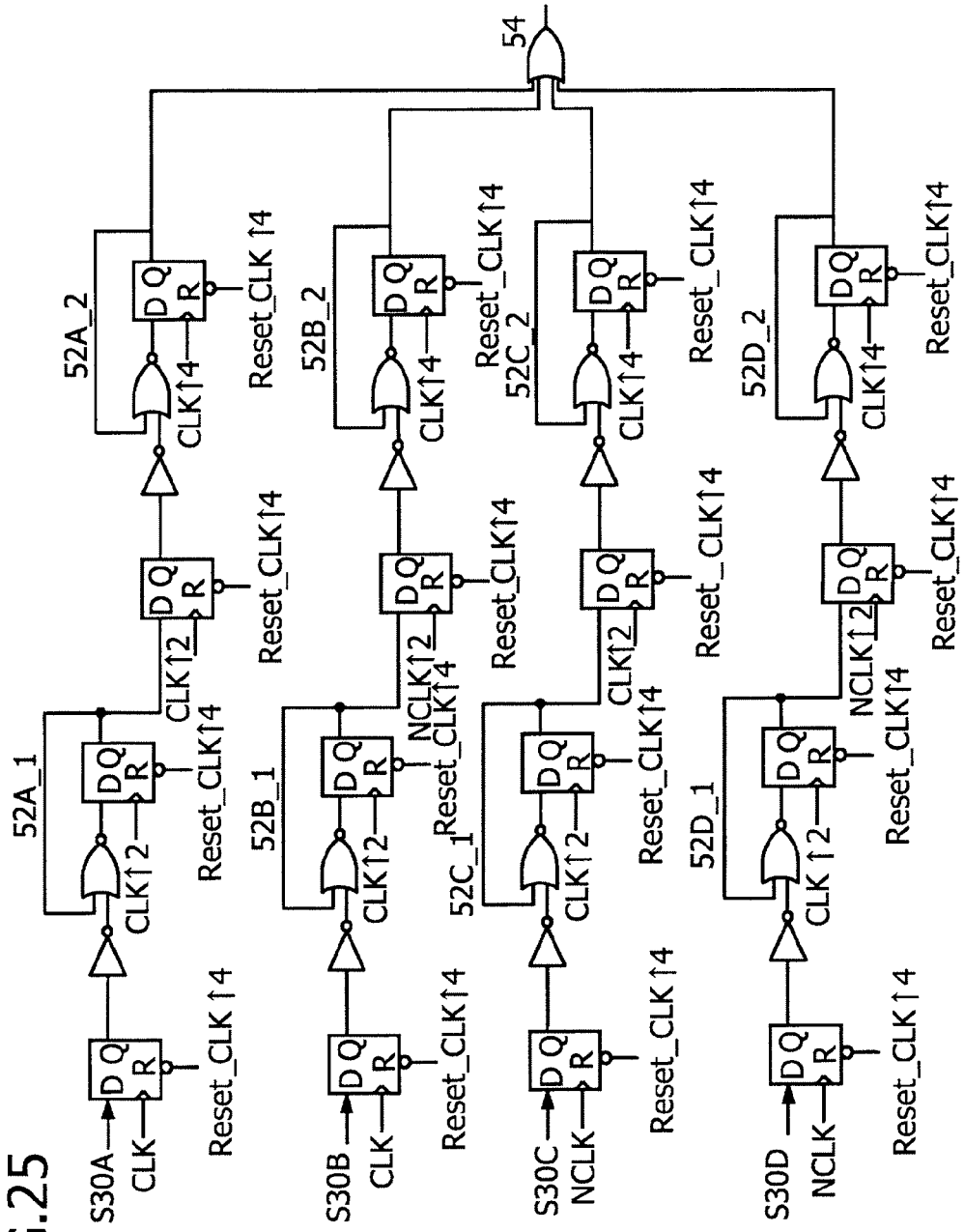
FIG. 25 is a circuit diagram illustrating a synthesizer and circuits configured to reduce a pulse width to one fourth.

FIG. 25 is a circuit diagram illustrating a synthesizer and circuits configured to reduce the pulse width to one fourth. The outputs S28A to S28D of the third-order ΔΣ modulator 28 in FIG. 24 are respectively modulated and turned into the outputs S30A to S30D of the first-order ΔΣ modulator, which are inputted to pulse-width one-fourth reduction circuits in FIG. 25. In the pulse-width one-fourth reduction circuits, the pulse width half-reduction circuits 52 in FIG. 20 are cascade-connected as circuits 52A_1 and 52A_2 are constituted, and the pulse width of respective input signals is reduced to one fourth. A pulse train in which each pulse width is reduced to one fourth according to the cascade connection is synthesized by the OR gate 54.

In the pulse width half-reduction circuits 52 that are cascade-connected, at a first stage, the sampling of the input signals S30A and S30B is carried out with the clock signal CLK, and the sampling of the input signals S30C and S30D is carried out with the clock signal NCLK whose phase is reverse-phase of the clock signal CLK. Further, at a second state, the sampling of input signals S30B and S30D are carried out with the clock signal NCLK whose phase is reverse-phase of the clock signal CLK, and the sampling of the input signals S30A and S30C is carried out with the clock signal CLK.

As is described above, according to the embodiments of the present invention, the high-order ΔΣ modulator converts the digital control signal outputted from the loop filter into the pseudorandom high-speed digital output signal, whereby reducing quantization noise in the low-frequency bandwidth, and the first-order ΔΣ modulator pulse-width modulates the pseudorandom digital output signal, and the low pass filter generates an analog control voltage signal, which is supplied to the electrode of the capacitor of the oscillator. Consequently, instead of digital analog conversion circuits, a high-precision analog control voltage is generated by the use of the first-order ΔΣ modulator, and the size of circuits is reduced.

The digitally controlled oscillator is applied to the digital PLL in FIG. 1, so that all the components except the oscillator is constituted by digital circuits.

The digitally controlled oscillator that has high precision and saves an area to be placed and is provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A digitally controlled oscillator, comprising:
    a high-order ΔΣ modulator configured to be of at least an order higher than a first order and configured to input a digital control signal and output a pseudorandom digital output signal;
    a first-order ΔΣ modulator configured to input the pseudorandom digital output signal and generate a control pulse signal including a pulse width corresponding to the pseudorandom digital output signal;
    a low pass filter configured to pass a low frequency component of the control pulse signal; and
    an oscillator configured to generate a high-frequency output signal whose frequency is controlled based on the control pulse signal outputted by the low pass filter so as to be a frequency corresponding to the digital control signal.

2. The digitally controlled oscillator according to claim 1, wherein the high-order ΔΣ modulator is configured to output the pseudorandom digital output signal of N bits in synchronism with a first clock signal, and the N is an integer of two or higher, and wherein the first-order ΔΣ modulator is configured to generate the control pulse signal in synchronism with a second clock signal whose frequency is $2^N$ time as high as a frequency of the first clock signal.

3. The digitally controlled oscillator according to claim 2, wherein the first-order ΔΣ modulator comprises an adder and a register configured to delay an added output of the adder in synchronism with the second clock signal, and the adder input the N-bit pseudorandom digital output signal as a first added input signal and the added output delayed by the register as a second added signal, and output a carry signal of the adder as the control pulse signal.

4. The digitally controlled oscillator according to claim 1, wherein the high-order ΔΣ modulator is configured to generate pseudorandom digital output signals of K bits and L bits in synchronism with a first clock signal as the pseudorandom digital output signal with N-bit, and the N is an integer of two or higher, and the K and the L are a positive integer smaller than the N, and wherein the first-order ΔΣ modulator comprises:
a first first-order ΔΣ modulator configured to input the K-bit pseudorandom digital output signal and generate a first control pulse signal in synchronism with a second clock signal whose frequency is $2^k$ times as high as the frequency of the first clock signal;
a second first-order ΔΣ modulator configured to input the L-bit pseudorandom digital output signal and generate a second control pulse signal in synchronism with a third clock signal whose frequency is $2^L$ times as high as the frequency of the first clock signal; and
a control pulse synthesizer configured to synthesize the first control pulse signal and the second control pulse signal of which each pulse width is reduced, and to output the control pulse signal.

5. The digitally controlled oscillator according to claim 4, wherein the high-order ΔΣ modulator comprises:
a first adder;
a first register configured to delay an added output of the first adder in synchronism with the first clock signal, wherein the first adder input the digital control signal as a first added input signal and the added output delayed by the first register as a second added signal;
a second adder;
a second register configured to delay an added output of the second adder in synchronism with the first clock signal;
a first differentiating circuit configured to differentiate a second carry signal of the second adder one time wherein the second adder input the added output delayed by the first register as a first added input signal and the added output delayed by the second register as a second added signal;
a third adder;
a third register configured to delay an added output of the third adder in synchronism with the first clock signal;
a second differentiating circuit configured to differentiate a third carry signal of the third adder two times wherein the first adder input the digital control signal as a first added input signal and the added output delayed by the first register as a second added signal; and
an output adder configured to add the first carry signal of the first adder and the one-time differentiating signal of the second carry signal to generate the K-bit pseudorandom digital output signal, wherein the first adder input the digital control signal as a first added input signal and the added output delayed by the first register as a second added signal,
wherein the second adder input the added output delayed by the first register as a first added input signal and the added output delayed by the second register as a second added signal,
wherein the third adder input the added output delayed by the second register as a first added input signal and the added output delayed by the third register as a second added signal, and
wherein the two-time differentiating signal of the third carry signal is outputted as the L-bit pseudorandom digital output signal.

6. The digitally controlled oscillator according to claim 1, wherein the high-order ΔΣ modulator is configured to generate K-bit and (K+1)-bit pseudorandom digital output signals in synchronism with a first clock as the pseudorandom digital output signal, and the K is a positive integer, wherein the first-order ΔΣ modulator comprises:
a first first-order ΔΣ modulator configured to input the K-bit pseudorandom digital output signal and generate a first control pulse signal in synchronism with a second clock signal whose frequency is $2^K$ times as high as the frequency of the first clock signal;
a second first-order ΔΣ modulator configured to input the (K+1)-bit pseudorandom digital output signal and generate a second control pulse signal in synchronism with the second clock signal; and
a control pulse synthesizer configured to synthesize the first control pulse signal and the second control pulse signal of which each pulse width is reduced in half, and to output the control pulse signal.

7. The digitally controlled oscillator according to claim 6, wherein the second first-order ΔΣ modulator comprises an adder and a register configured to delay an added output of the adder in synchronism with the second clock signal, wherein the adder input a most-significant-bit pseudorandom digital output signal, out of the (K+1)-bit pseudorandom digital output signals, as a carry signal, the K-bit pseudorandom digital output signal excluding the most-significant-bit, as a first input signal, and the added output delayed by the register, as a second added signal.

8. A digital PLL comprising:
the digitally controlled oscillator according to claim 1;
a phase comparator configured to compare a reference phase signal generated based on a digital reference frequency signal with an output phase signal generated based on the high-frequency output signal and to generate a digital phase difference signal; and
a loop filter configured to remove a high-frequency component of the digital phase difference signal and to output the digital control signal corresponding to the digital phase difference signal.

9. The digital PLL according to claim 8, wherein the oscillator of the digitally controlled oscillator is an LC oscillator, the oscillator comprising:
a first capacitance circuit whose capacitance value is controlled based on a control code;
a second capacitance circuit whose capacitance value is controlled based on a rough-adjustment digital control signal of the digital control signal; and
a third capacitance circuit whose capacitance value is controlled based on a fine-adjustment digital control signal of the digital control signal, and wherein the fine-adjustment digital control signal, out of the digital control signals, is inputted to the high-order ΔΣ modulator.

10. The digital PLL according to claim 9, wherein the capacitance value of the third capacitance circuit is controlled based on the control pulse signal generated from the fine-adjustment digital control signal.

* * * * *